United States Patent
Degai et al.

(10) Patent No.: US 11,152,215 B2
(45) Date of Patent: Oct. 19, 2021

(54) METHOD OF MANUFACTURING SEMICONDUCTOR DEVICE, SUBSTRATE PROCESSING APPARATUS AND NON-TRANSITORY COMPUTER-READABLE RECORDING MEDIUM

(71) Applicant: KOKUSAI ELECTRIC CORPORATION, Tokyo (JP)

(72) Inventors: Motomu Degai, Toyama (JP); Kimihiko Nakatani, Toyama (JP); Hiroshi Ashihara, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/535,677

(22) Filed: Aug. 8, 2019

(65) Prior Publication Data
US 2019/0371609 A1    Dec. 5, 2019

Related U.S. Application Data

(63) Continuation of application No. PCT/JP2017/013634, filed on Mar. 31, 2017.

(51) Int. Cl.
*H01L 21/285* (2006.01)
*H01L 21/306* (2006.01)
(Continued)

(52) U.S. Cl.
CPC .............. *H01L 21/285* (2013.01); *C23F 4/00* (2013.01); *H01L 21/0228* (2013.01);
(Continued)

(58) Field of Classification Search
CPC .............. H01L 21/285; H01L 21/30604; H01L 21/32135; H01L 21/0228; H01L 21/28562;
(Continued)

(56) References Cited

U.S. PATENT DOCUMENTS

2001/0000632 A1 * 5/2001 Yoshizawa ........ H01L 21/76879
257/758
2008/0135516 A1    6/2008 Yokogawa et al.
(Continued)

FOREIGN PATENT DOCUMENTS

| JP | 05-062934 A | 3/1993 |
|---|---|---|
| JP | 09-232287 A | 9/1997 |

(Continued)

OTHER PUBLICATIONS

Japanese Office Action dated Sep. 17, 2020 for Japanese Patent Application No. 2019-508123.
(Continued)

*Primary Examiner* — Anita K Alanko
(74) *Attorney, Agent, or Firm* — Volpe Koenig

(57) ABSTRACT

Described herein is a technique capable of selectively growing a film with a high selectivity on a substrate with surface portions of different materials. According to one aspect of the technique of the present disclosure, there is provided a method of manufacturing a semiconductor device including: (a) forming a second metal film on a substrate with a first metal film and an insulating film formed thereon by alternately supplying a metal-containing gas and a reactive gas onto the substrate, wherein an incubation time on the insulating film is longer than that on the first metal film; and (b) supplying an etching gas onto the substrate to remove the second metal film formed on the insulating film while allowing the second metal film to remain on the first metal film, wherein the second metal film is selectively grown on the first metal film by alternately repeating (a) and (b).

7 Claims, 11 Drawing Sheets

(51) Int. Cl.
*H01L 21/768* (2006.01)
*C23F 4/00* (2006.01)
*H01L 21/3213* (2006.01)
*H01L 21/02* (2006.01)

(52) U.S. Cl.
CPC .. *H01L 21/28562* (2013.01); *H01L 21/30604* (2013.01); *H01L 21/30621* (2013.01); *H01L 21/32135* (2013.01); *H01L 21/76865* (2013.01); *H01L 21/76876* (2013.01)

(58) Field of Classification Search
CPC ......... H01L 21/30621; H01L 21/76865; H01L 21/76876; C23F 4/00; C23C 16/45578; C23C 16/04; C23C 16/45546; C23C 16/45534; C23C 16/56; C23C 16/14; C23C 16/045
See application file for complete search history.

(56) References Cited

U.S. PATENT DOCUMENTS

| | | |
|---|---|---|
| 2013/0256838 A1 | 10/2013 | Sanchez et al. |
| 2015/0024592 A1 | 1/2015 | Chandrashekar et al. |
| 2016/0314981 A1 | 10/2016 | Yoon et al. |
| 2016/0351402 A1 | 12/2016 | Suzuki et al. |
| 2016/0351444 A1 | 12/2016 | Schloss et al. |
| 2017/0040214 A1* | 2/2017 | Lai .................. H01L 21/32136 |

FOREIGN PATENT DOCUMENTS

| | | |
|---|---|---|
| JP | 11-087268 A | 3/1999 |
| JP | 2008-124181 A | 5/2008 |
| JP | 2012-067328 A | 4/2012 |
| JP | 2012-204453 A | 10/2012 |
| JP | 2015-029097 A | 2/2015 |
| JP | 2016-225396 A | 12/2016 |
| JP | 2017-014615 A | 1/2017 |
| JP | 2017-053024 A | 3/2017 |
| KR | 10-2014-0141664 A | 12/2014 |
| KR | 10-2016-0127891 A | 11/2016 |

OTHER PUBLICATIONS

International Search Report dated May 16, 2017 of the PCT International Application No. PCT/JP2017/013634.
Korean Office Action dated Nov. 29, 2020 for Korean Patent Application No. 10-2019-7022784.

* cited by examiner

METHOD OF MANUFACTURING SEMICONDUCTOR DEVICE, SUBSTRATE PROCESSING APPARATUS AND NON-TRANSITORY COMPUTER-READABLE RECORDING MEDIUM

CROSS-REFERENCE TO RELATED PATENT APPLICATION

This non-provisional U.S. patent application claims priority under 35 U.S.C. § 119 of International Application No. PCT/JP2017/013634, filed on Mar. 31, 2017, in the WIPO, the entire contents of which are hereby incorporated by reference.

BACKGROUND

1. Field

The present disclosure relates to a method of manufacturing a semiconductor device, a substrate processing apparatus and a non-transitory computer-readable recording medium.

2. Description of the Related Art

As one of manufacturing processes of a semiconductor device, for example, a substrate processing such as a film-forming process and an oxidation process may be performed by supplying a process gas to a substrate accommodated in a process chamber in order to form a component such as a control gate film of a flash memory, a word line electrode of a MOSFET (Metal-Oxide-Semiconductor Field-Effect Transistor) and a barrier film.

According to the conventional method of manufacturing the semiconductor device, it is possible to selectively grow (form) a film by using method (also referred to as a "selective growth method") such as an epitaxial growth technique capable of growing silicon (Si) or silicon germanium (SiGe) on a crystalline silicon substrate and a selective CVD method capable of growing the film by continuously supplying a source gas. The selective growth method such as the epitaxial growth technique and the selective CVD method uses a growth time difference (also referred to as an "incubation time") of the film on surfaces of different materials. However, since it is difficult to form the film thick within a finite time and the selectivity is imperfect, a practical use of the selective growth method may be limited. In addition, in order to process the semiconductor device, various processing films such as a so-called hard mask may be used. However, conventionally, it is necessary to process the hard mask itself by performing an exposure process using a material such as a photoresist in order to divide a surface of the substrate into a surface portion to be processed (etched) and a surface portion not to be processed. Therefore, a manufacturing cost of the semiconductor device is increased by performing the exposure process of the photoresist when processing the hard mask. If a selective growth technique with improved selectivity can be provided, it is possible to distinguish the surface portion to be processed from the surface portion not to be processed by the substrate processing such as the film-forming process, and as a result, it is possible to reduce the manufacturing cost of the semiconductor device.

SUMMARY

Described herein is a technique capable of selectively growing a film with a high selectivity on a substrate with surface portions of different materials.

According to one aspect of the technique of the present disclosure, there is provided a method of manufacturing a semiconductor device including: (a) forming a second metal film on a substrate with a first metal film and an insulating film formed on a surface thereof by alternately supplying a metal-containing gas and a reactive gas onto the substrate, wherein an incubation time on the insulating film is longer than that on the first metal film; and (b) supplying an etching gas onto the substrate to remove the second metal film formed on the insulating film while allowing the second metal film to remain on the first metal film, wherein the second metal film is selectively grown on the first metal film by alternately repeating (a) and (b).

DETAILED DESCRIPTION

<Embodiments>

Figure 1:
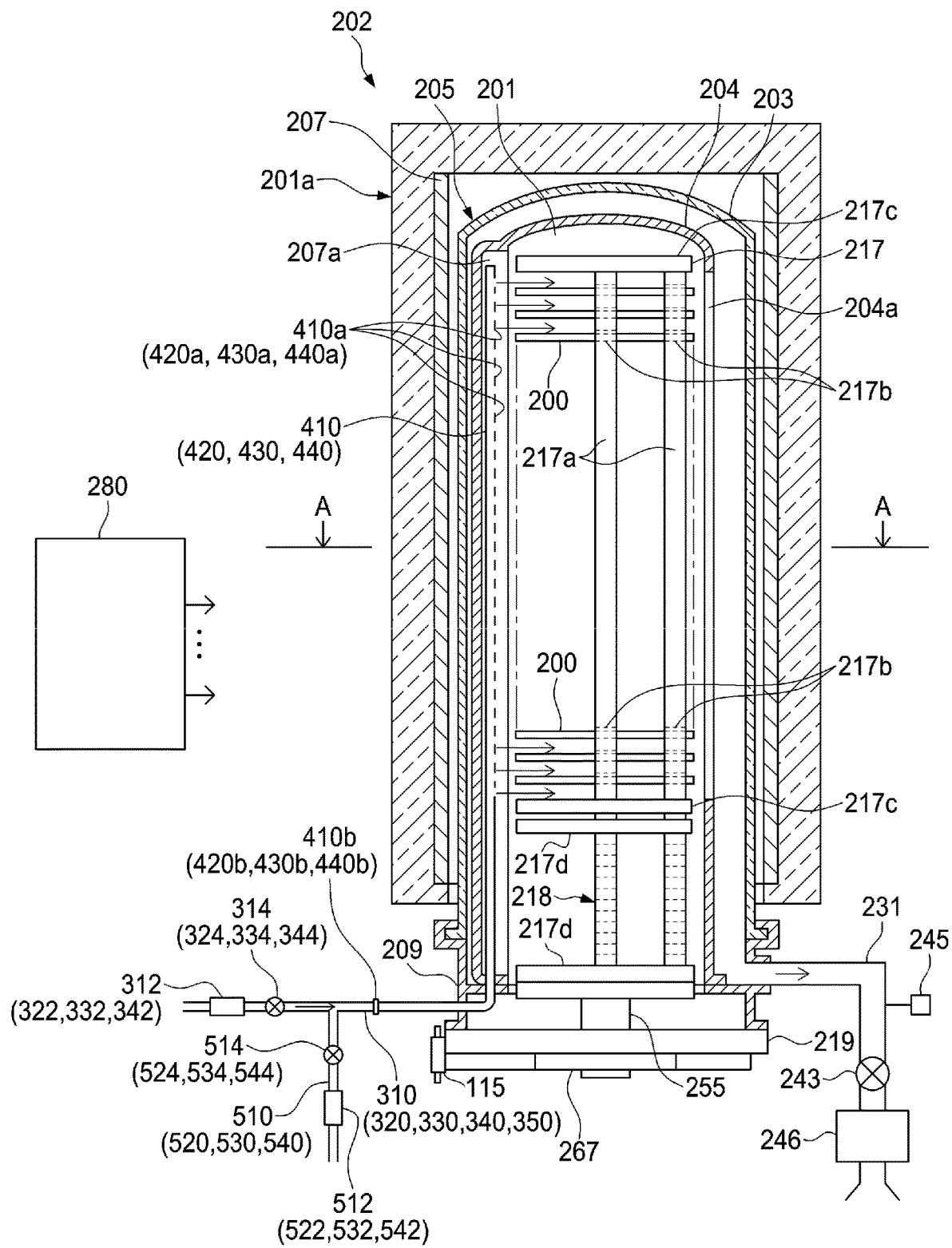
FIG. 1 schematically illustrates a vertical cross-section of a process furnace of a substrate processing apparatus according to one or more embodiments described herein.

Hereinafter, one or more embodiments (hereinafter, simply referred to as "embodiments") according to the technique of the present disclosure will be described. As integrated circuits are miniaturized, a method such as a double patterning method may be adopted, and the number of steps for forming a microstructure is increasing. That is, a manufacturing cost for forming the microstructure is increasing. When forming the microstructure, a plurality of steps is performed. For example, first, a film is formed (deposited)

on a wafer (also referred to as a "substrate") uniformly, then a desired pattern is formed, and finally, unnecessary portions are removed. According to the present specification, it is intended to provide the technique capable of forming the film only at a portion where it is desired to form the film in order to solve the above-described problem of increasing the number of the steps.

For example, when filling a structure such as a hole and a trench defined by a bottom (indicated by "A" in FIGS. 4A through 4C) and a sidewall (indicated by "B" in FIGS. 4A through 4C), a film (indicated by "C" in FIGS. 4A through 4C) may be grown on both the bottom (also referred to as a "surface portion A") and the side wall (also referred to as a "surface portion B"). However, finally due to the film growing from the side wall, an inlet of a gas is blocked, and a void or a seam may occur. If the film C is formed selectively, that is, if the film C is formed on the surface portion A but not on the surface portion B, it is possible to fill the structure such as the hole and the trench without the void or the seam by growing the film C from the bottom (surface portion A) of the structure.

Ideally, when forming the film, it is possible to grow the film only on a desired portion by using a selective growth method. However, in fact, it may be difficult to form the film only on the desired portion only by the selective growth method since the selectivity is imperfect (that is, the selectivity is defective). In addition, when a process gas (film-forming gas) is continuously supplied to form the film selectively, another problem occurs. That is, a thickness of the film formed (deposited) on the desired portion depends on a surface density of the desired portion. The phenomenon described above is referred to as a "loading effect", and the loading effect is a problem to be overcome in the selective growth method performed by continuously supplying the process gas. Hereinafter, an example of the embodiments in which a film-forming step (also referred to as a "deposition step") and an etching step are repeatedly and alternately performed will be described. In the example, the film-forming step itself may be repeatedly performed and the etching step itself may be repeatedly performed. According to the example of the embodiments, it is possible to supply a film-forming source and an etching source sufficiently in excess to a surface (the desired portion) on which the film is grown. Therefore, it is possible to mitigate the loading effect greatly.

Figure 4A:
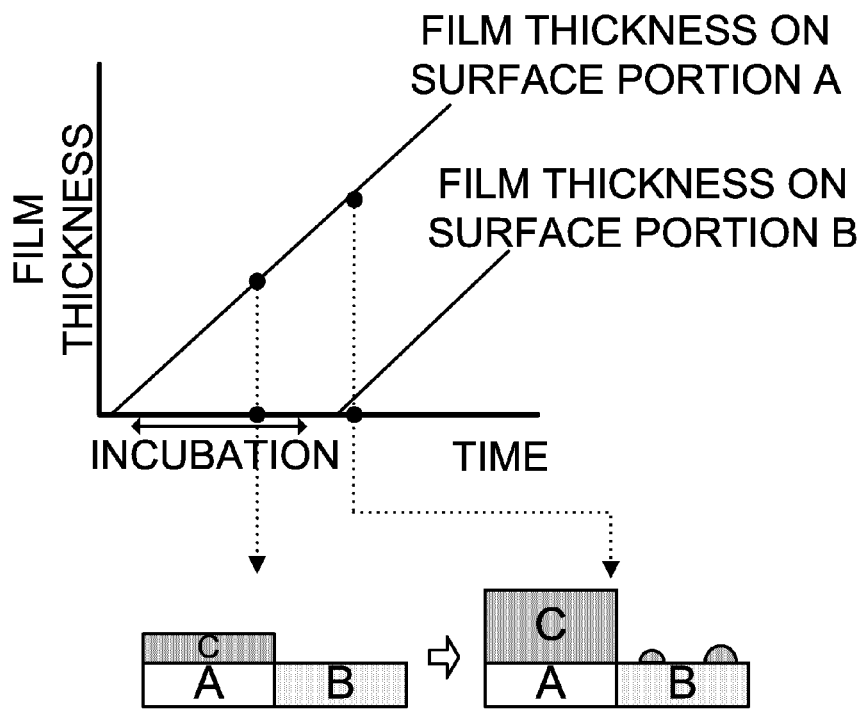
FIG. 4A is a diagram for explaining an incubation time.
Figure 4B:
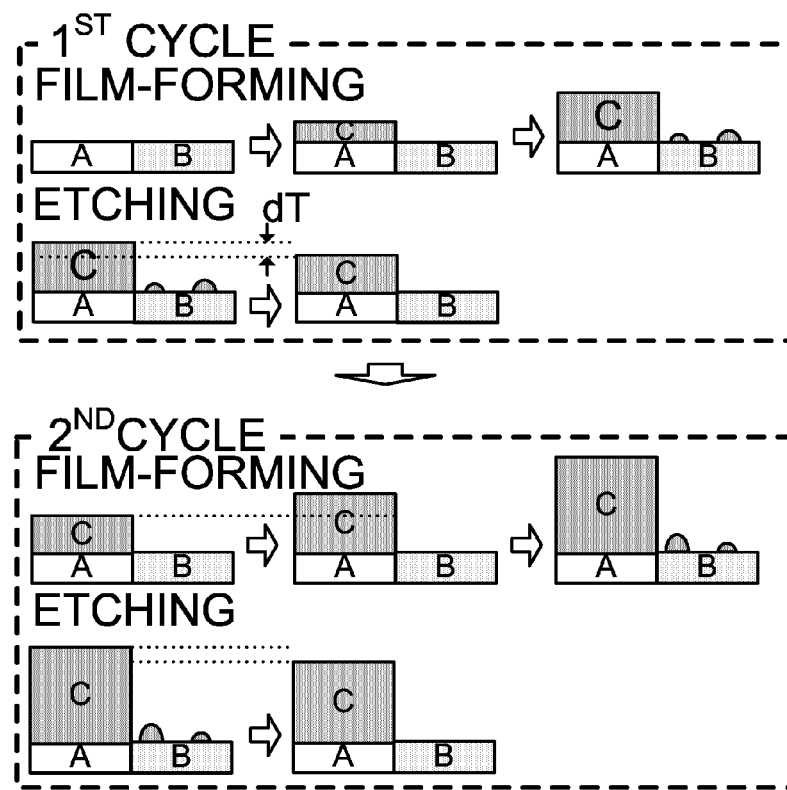
FIG. 4B is a diagram for explaining an alternating sequence of a film-forming step and an etching step and FIG. 4C is schematically illustrates a growth of a film by the alternating sequence of the film-forming step and the etching step.

As shown in FIG. 4A, a delay (also referred to as an "incubation time") until the film starts to adhere on the substrate differs between the surface portions of the substrate. That is, the delay differs between the surface portion A and the surface portion B. As the film-forming step is performed, the nuclear growth starts and the film starts to adhere on the surface portion B whose incubation time is longer than that on the surface portion A. Therefore, it is difficult to obtain the film with a desired thickness on the surface portion A on which the film is intended to be grown without growing the film on the surface portion B on which the film is not intended to be grown. Therefore, the film which has started to grow on the surface portion B is removed by the etching step. If the film C is to be formed only on the surface portion A, a sequence (also referred to as an "alternating sequence") shown in FIG. 4B is performed by alternately repeating the film-forming step and the etching step until the desired film thickness is obtained on the surface portion A. That is, the film C is formed on the surface portion A selectively with respect to the surface portion B.

Figure 4C:
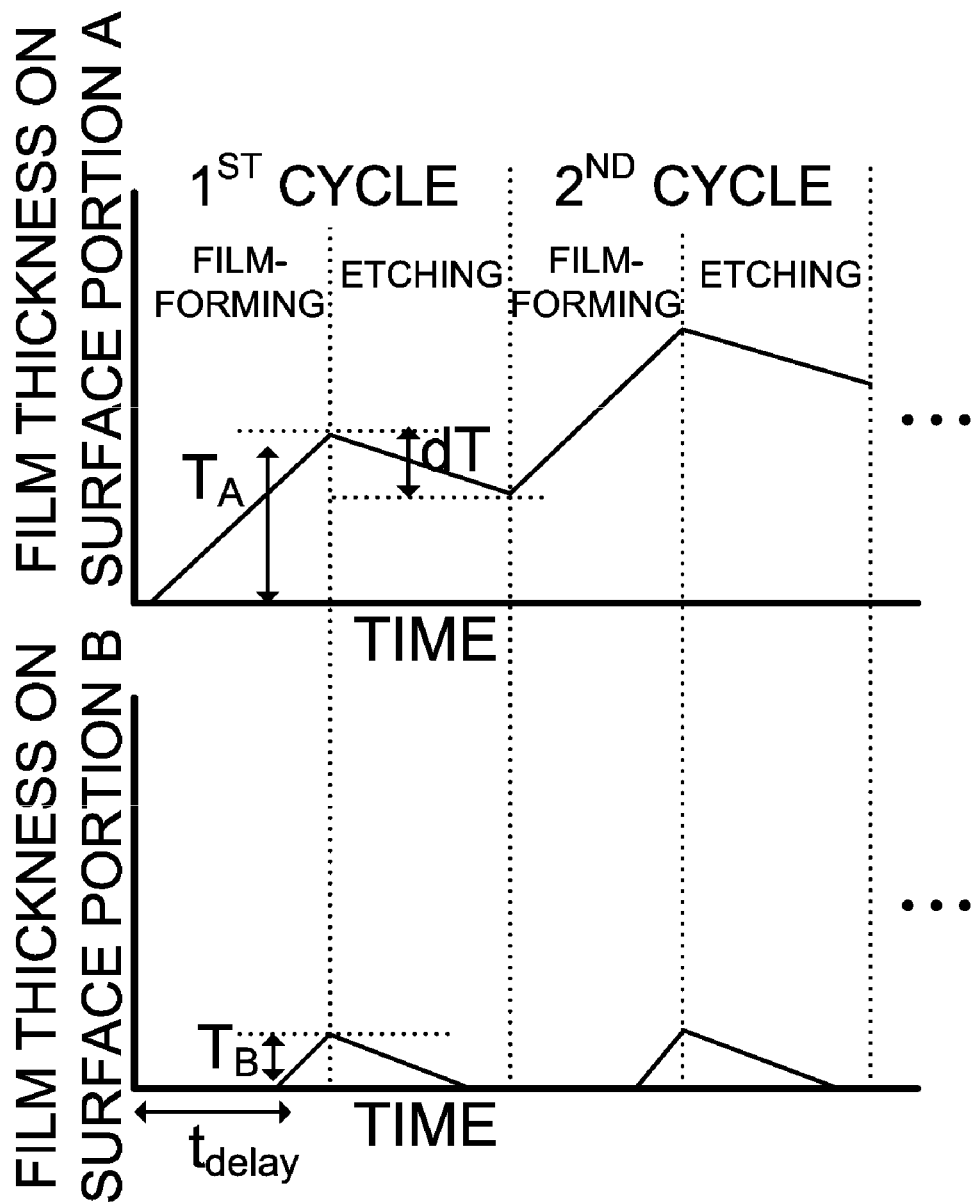

FIG. 4C schematically illustrates a change of the thickness of the film with respect to a time of performing the sequence shown in FIG. 4B. The film starts to be adhered (deposited) on the surface portion A immediately after the start of the film-forming step. The film starts to be adhered (deposited) on the surface portion B after the lapse of the incubation time $t_{delay}$. The etching step is performed when the film starts to be adhered on the surface portion B to remove the film on the surface portion B. In the etching step, the film adhered on the surface portion A is also etched by an amount dT. In order to increase the thickness of the film on the surface portion A while suppressing the formation of the film on the surface portion B, it is required that the thickness $T_A$ of the film adhered to the surface portion A is greater that the amount dT and the amount dT is greater that the thickness $T_B$ of the film adhered to the surface portion B. Therefore, it is required a high controllability of the etching step. As a method of improving (enhancing) the controllability of the etching step, the etching step may be performed at a low temperature and a low pressure. As another method of improving the controllability of the etching step, a sequence may be performed in which a modifying gas capable of modifying the surface of the film to be etched and an etching gas capable of etching the modified surface of the film without etching the film are alternately supplied. Preferably, a thickness of the modified surface (modified layer) by the modifying gas is saturated with respect to an amount of the exposure of the modifying gas.

First Embodiment

Hereinafter, a first embodiment according to the technique of the present disclosure will be described with reference to FIGS. 1 through 5. A substrate processing apparatus according to the first embodiment is configured as an example of a semiconductor manufacturing apparatus used for manufacturing a semiconductor device.

(1) Configuration of Substrate Processing Apparatus

The substrate processing apparatus includes a process furnace 202 provided with a heater 207 serving as a heating device (also referred to as a "heating mechanism" or a "heating system"). The heater 207 is of a cylindrical shape, and is vertically installed while being supported by a heater base (not shown) serving as a support plate.

An outer tube (also referred to as a "reaction tube") 203 is provided in an inner side of the heater 207 to be aligned in a manner concentric with the heater 207. A reaction vessel (also referred to as a "process vessel") is constituted by the outer tube 203. The outer tube 203 is made of a heat resistant material such as quartz ($SiO_2$) and silicon carbide (SiC). The outer tube 203 is of a cylindrical shape with an open lower end and a closed upper end. A manifold (also referred to as an "inlet flange") 209 is provided under the outer tube 203 to be aligned in a manner concentric with the outer tube 203. The manifold 209 is made of a metal such as stainless steel (SUS). The manifold 209 is of a cylindrical shape with open upper and lower ends. An O-ring (not shown) serving as a sealing part is provided between the upper end of the manifold 209 and the outer tube 203. As the manifold 209 is supported by the heater base, the outer tube 203 is installed vertically.

An inner tube 204 constituting the reaction vessel is provided in an inner side of the outer tube 203. The inner tube 204 is made of a heat resistant material such as quartz ($SiO_2$) and silicon carbide (SiC). The inner tube 204 is of a cylindrical shape with a closed upper end and an open lower end. The process vessel (the reaction vessel) is constituted mainly by the outer tube 203, the inner tube 204 and the manifold 209. A process chamber 201 is provided in a hollow cylindrical portion (an inside of the inner tube 204) of the process vessel.

The process chamber 201 is configured to accommodate a boat 217 capable of accommodating (supporting or holding) a plurality of wafers including a wafer 200 vertically arranged in a horizontal orientation in a multistage manner.

Nozzles 410, 420, 430 and 440 are provided in the process chamber 201 so as to penetrate sidewalls of the manifold 209 and the inner tube 204. Gas supply pipes 310, 320, 330 and 340 are connected to the nozzles 410, 420, 430 and 440, respectively. However, the process furnace 202 according to the embodiments is not limited thereto. For example, the number of the nozzles may be changed appropriately as necessary.

MFCs (Mass Flow Controllers) 312, 322, 332 and 342 serving as flow rate controllers (flow rate control mechanisms) and valves 314, 324, 334 and 344 serving as opening/closing valves are sequentially installed at the gas supply pipes 310, 320, 330 and 340, respectively, from the upstream sides to the downstream sides of the gas supply pipes 310, 320, 330 and 340. Gas supply pipes 510, 520, 530 and 540 configured to supply an inert gas are connected to the gas supply pipes 310, 320, 330 and 340 at the downstream sides of the valves 314, 324, 334 and 344, respectively. MFCs 512, 522, 532 and 542 serving as flow rate controllers (flow rate control mechanisms) and valves 514, 524, 534 and 544 serving as opening/closing valves are sequentially installed at the gas supply pipes 510, 520, 530 and 540, respectively, from the upstream sides to the downstream sides of the gas supply pipes 510, 520, 530 and 540.

The nozzles 410, 420, 430 and 440 are connected to the gas supply pipes 310, 320, 330 and 340, respectively. The nozzles 410, 420, 430 and 440 may include L-shaped nozzles. Horizontal portions of the nozzles 410, 420, 430 and 440 are installed through the sidewalls of the manifold 209 and the inner tube 204. Vertical portions of the nozzles 410, 420, 430 and 440 protrude outward from the inner tube 204 and are installed in a spare chamber 201a having a channel shape (a groove shape) extending in the vertical direction. That is, the vertical portions of the nozzles 410, 420, 430 and 440 are installed in the spare chamber 201a toward the top of the inner tube 204 (in the direction in which the plurality of the wafers including the wafer 200 is stacked) and along the inner wall of the inner tube 204.

The nozzles 410, 420, 430 and 440 extend from a lower region of the process chamber 201 to an upper region of the process chamber 201. The nozzles 410, 420, 430 and 440 are provided with a plurality of gas supply holes 410a, a plurality of gas supply holes 420a, a plurality of gas supply holes 430a and a plurality of gas supply holes 440a facing the plurality of the wafers including the wafer 200, respectively, such that the process gas is supplied to the plurality of the wafers through the plurality of the gas supply holes 410a, the plurality of the gas supply holes 420a, the plurality of the gas supply holes 430a and the plurality of the gas supply holes 440a of the nozzles 410, 420, 430 and 440. The plurality of the gas supply holes 410a, the plurality of the gas supply holes 420a, the plurality of the gas supply holes 430a and the plurality of the gas supply holes 440a are provided from a lower portion to an upper portion of the inner tube 204, and have the same opening area and the same pitch. However, the plurality of the gas supply holes 410a, the plurality of the gas supply holes 420a, the plurality of the gas supply holes 430a and the plurality of the gas supply holes 440a are not limited thereto. The opening areas of the plurality of the gas supply holes 410a, the plurality of the gas supply holes 420a, the plurality of the gas supply holes 430a and the plurality of the gas supply holes 440a may gradually increase from the lower portion toward the upper portion of the inner tube 204 to maintain the uniformity of the amounts of the gas (process gas) supplied through the plurality of the gas supply holes 410a, the plurality of the gas supply holes 420a, the plurality of the gas supply holes 430a and the plurality of the gas supply holes 440a.

The plurality of the gas supply holes 410a, the plurality of the gas supply holes 420a, the plurality of the gas supply holes 430a and the plurality of the gas supply holes 440a of the nozzles 410, 420, 430 and 440 are provided from a lower portion to an upper portion of the boat 217 described later. Therefore, the process gas supplied into the process chamber 201 through the plurality of the gas supply holes 410a, the plurality of the gas supply holes 420a, the plurality of the gas supply holes 430a and the plurality of the gas supply holes 440a of the nozzles 410, 420, 430 and 440 is supplied onto the plurality of the wafers including the wafer 200 accommodated in the boat 217 from the lower portion to the upper portion thereof, that is, the entirety of the plurality of the wafers accommodated in the boat 217. The nozzles 410, 420, 430 and 440 extend from the lower region to the upper region of the process chamber 201. However, the nozzles 410, 420, 430 and 440 may extend only to the vicinity of a ceiling of the boat 217.

A reducing gas serving as the process gas is supplied into the process chamber 201 through the gas supply pipe 310 provided with the WC 312 and the valve 314 and the nozzle 410. The reducing gas may also be referred to as a "reactive gas". The reducing gas may include a first reducing gas and a second reducing gas. As the first reducing gas, for example, a boron-containing gas containing boron (B) such as diborane ($B_2H_6$) gas may be used. As the second reducing gas, for example, a hydrogen-containing gas containing hydrogen (H) atoms such as hydrogen ($H_2$) gas may be used. Depending on the contents of a substrate processing described later, only one of the first reducing gas and the second reducing gas may be supplied into the process chamber 201, or the first reducing gas and the second reducing gas may be switched with each other to be supplied into the process chamber 201 using a common pipe configured to switch between the supply of the first reducing gas and the supply of the second reducing gas. When the hydrogen ($H_2$) gas is used in a modifying step such as a pre-treatment step or a post-treatment step described later, the reducing gas (that is, the second reducing gas) may also be referred to as a modifying gas (that is, a second modifying gas).

A metal-containing gas containing a metal element (also referred to as a "metal-containing source" or a "metal-containing source gas") is supplied into the process chamber 201 through the gas supply pipe 320 provided with the MFC 322 and the valve 324 and the nozzle 420. The metal-containing gas serves as the process gas. As the metal-containing gas, for example, a tungsten hexafluoride ($WF_6$) gas containing tungsten (W) as the metal element may be used.

An etching gas serving as the process gas is supplied into the process chamber 201 through the gas supply pipe 330 provided with the MFC 332 and the valve 334 and the nozzle 430. As the etching gas, for example, a fluorine (F)-containing gas such as nitrogen trifluoride ($NF_3$) gas which is a halide may be used.

A modifying gas serving as the process gas is supplied into the process chamber 201 through the gas supply pipe 340 provided with the MFC 342 and the valve 344 and the nozzle 440. As the modifying gas, for example, an oxygen-containing gas such as ozone ($O_3$) gas which is an oxidizing gas may be used. As the modifying gas, for example, a nitrogen-containing gas such as ammonia ($NH_3$) gas which is a nitriding gas may also be used. When the hydrogen ($H_2$) gas is used as the modifying gas in the modifying step described later, the ozone ($O_3$) gas or the ammonia ($NH_3$) gas may be referred to as a first modifying gas, and the hydrogen ($H_2$) gas may be referred to as the second modifying gas.

An inert gas such as nitrogen ($N_2$) gas is supplied into the process chamber 201 through the gas supply pipes 510, 520, 530 and 540 provided with the MFCs 512, 522, 532 and 542 and the valves 514, 524, 534 and 544, and the nozzles 410, 420, 430 and 440, respectively. While the embodiments will be described by way of an example in which the $N_2$ gas is used as the inert gas, the inert gas according to the embodiments is not limited thereto. For example, rare gases such as argon (Ar) gas, helium (He) gas, neon (Ne) gas and xenon (Xe) gas may be used as the inert gas instead of the $N_2$ gas.

While a process gas supply system may be constituted mainly by the gas supply pipes 310, 320, 330 and 340, the MFCs 312, 322, 332 and 342, the valves 314, 324, 334 and 344 and the nozzles 410, 420, 430 and 440, only the nozzles 410, 420, 430 and 440 may be considered as the process gas supply system. The process gas supply system may be simply referred to as a "gas supply system". When the reducing gas is supplied through the gas supply pipe 310, a reducing gas supply system may be constituted mainly by the gas supply pipe 310, the MFC 312 and the valve 314. The reducing gas supply system may further include the nozzle 410. When the metal-containing gas is supplied through the gas supply pipe 320, a metal-containing gas supply system may be constituted mainly by the gas supply pipe 320, the MFC 322 and the valve 324. The metal-containing gas supply system may further include the nozzle 420. When the etching gas is supplied through the gas supply pipe 330, an etching gas supply system may be constituted mainly by the gas supply pipe 330, the MFC 332 and the valve 334. The etching gas supply system may further include the nozzle 430. When the modifying gas is supplied through the gas supply pipe 340, a modifying gas supply system may be constituted mainly by the gas supply pipe 340, the MFC 342 and the valve 344. The modifying gas supply system may further include the nozzle 440. An inert gas supply system may be constituted mainly by the gas supply pipes 510, 520, 530 and 540, the MFCs 512, 522, 532 and 542, and the valves 514, 524, 534 and 544. The inert gas supply system may also be referred to as a "purge gas supply system", a "dilution gas supply system" or a "carrier gas supply system".

According to the embodiments, the gas such as the process gas is supplied into a vertically long annular space which is defined by the inner wall of the inner tube 204 and the edges (peripheries) of the plurality of the wafers including the wafer 200 through the nozzles 410, 420, 430 and 440 provided in the spare chamber 201a. The gas is ejected into the inner tube 204 around the plurality of the wafers through the plurality of the gas supply holes 410a, the plurality of the gas supply holes 420a, the plurality of the gas supply holes 430a and the plurality of the gas supply holes 440a of the nozzles 410, 420, 430 and 440 facing the plurality of the wafers, respectively. Specifically, the gas such as the process gas is ejected into the inner tube 204 in a direction parallel to the surfaces of the plurality of the wafers, that is, in a horizontal direction through the plurality of the gas supply holes 410a, the plurality of the gas supply holes 420a, the plurality of the gas supply holes 430a and the plurality of the gas supply holes 440a of the nozzles 410, 420, 430 and 440, respectively.

An exhaust hole (exhaust port) 204a facing the nozzles 410, 420, 430 and 440 is provided in the sidewall of the inner tube 204 opposite to the spare chamber 201a. That is, the exhaust hole (exhaust port) 204a is provided at a location opposite to the spare chamber 201a by 180°. For example, the exhaust hole 204a may have a narrow slit shape elongating vertically. Therefore, the gas supplied into the process chamber 201 through the plurality of the gas supply holes 410a, the plurality of the gas supply holes 420a, the plurality of the gas supply holes 430a and the plurality of the gas supply holes 440a of the nozzles 410, 420, 430 and 440, respectively, flows over parallel to the surfaces of the plurality of the wafers including the wafer 200. The gas that has flowed over parallel to the surfaces of the plurality of the wafers, that is, a remaining gas (residual gas) is exhausted through the exhaust hole 204a into an exhaust channel 206 which is a gap provided between the inner tube 204 and the outer tube 203. The gas flowing in the exhaust channel 206 flows into an exhaust pipe 231 and is then discharged out of the process furnace 202.

The exhaust hole 204a is provided to face the plurality of the wafers including the wafer 200. Preferably, the exhaust hole 204a extends to face the boat 217 from the lower portion to the upper portion of the boat 217. The gas supplied in the vicinity of the plurality of the wafers in the process chamber 201 through the plurality of the gas supply holes 410a, the plurality of the gas supply holes 420a, the plurality of the gas supply holes 430a and the plurality of the gas supply holes 440a flows in the horizontal direction (that is, a direction parallel to the surfaces of the plurality of the wafers). The gas that has flowed over parallel to the surfaces of the plurality of the wafers, that is, the remaining gas (residual gas) is exhausted parallel to main surfaces of the plurality of the wafers through the exhaust hole 204a into the exhaust channel 206. The exhaust hole 204a is not limited to a slit-shaped through-hole. For example, the exhaust hole 204a may include a plurality of holes.

The exhaust pipe 231 configured to exhaust an inner atmosphere of the process chamber 201 is provided at the manifold 209. A pressure sensor 245, an APC (Automatic Pressure Controller) valve 243 and a vacuum pump 246 are sequentially connected to the exhaust pipe 231 from the upstream side to the downstream side of the exhaust pipe 231. The pressure sensor 245 serves as a pressure detector (pressure detection mechanism) to detect an inner pressure of the process chamber 201, and the vacuum pump 246 serves as a vacuum exhaust apparatus. With the vacuum pump 246 in operation, the APC valve 243 may be opened or closed to vacuum-exhaust the process chamber 201 or stop the vacuum exhaust. With the vacuum pump 246 in operation, the opening degree of the APC valve 243 may be adjusted in order to control the inner pressure of the process chamber 201. An exhaust system (also referred to as an "exhaust line") may be constituted mainly by the exhaust hole 204a, the exhaust channel 206, the exhaust pipe 231, the APC valve 243 and the pressure sensor 245. The exhaust system may further include the vacuum pump 246.

A seal cap 219, serving as a furnace opening cover capable of sealing a lower end opening of the manifold 209 in airtight manner, is provided under the manifold 209. The seal cap 219 is in contact with the lower end of the manifold 209 from thereunder. The seal cap 219 is made of a metal such as SUS, and is disk-shaped. An O-ring (not shown), serving as a sealing part and being in contact with the lower end of the manifold 209, is provided on an upper surface of the seal cap 219. A rotating mechanism 267 configured to rotate the boat 217 accommodating the plurality of the wafers including the wafer 200 is provided at the seal cap 219 opposite to the process chamber 201. A rotating shaft 255 of the rotating mechanism 267 is connected to the boat 217 through the seal cap 219. As the rotating mechanism 267 rotates the boat 217, the plurality of the wafers is rotated. The seal cap 219 may be moved upward or downward in the vertical direction by a boat elevator 115 provided outside the outer tube 203 vertically and serving as an elevating mechanism. When the seal cap 219 is moved upward or downward by the boat elevator 115, the boat 217 may be transferred (loaded) into the process chamber 201 or transferred (unloaded) out of the process chamber 201. The boat elevator 115 serves as a transfer device (transfer mechanism) that loads the boat 217 and the plurality of the wafers including the wafer 200 accommodated in the boar 217 into the process chamber 201 or unloads the boat 217 and the plurality of the wafers including the wafer 200 accommodated in the boar 217 out of the process chamber 201.

The boat 217 serving as a substrate retainer accommodates (supports) the plurality of the wafers including the wafer 200 (for example, 25 to 200 wafers). In the boat 217, the plurality of the wafers is horizontally oriented with predetermined intervals therebetween. That is, the plurality of the wafers are supported by the boat 217 with their centers aligned with each other. For example, the boat 217 is made of a heat resistant material such as quartz and SiC. An insulating plate 218 is provided under the boat 217 in multi-stages (not shown). The insulating plate 218 is made of a heat resistant material such as quartz and SiC. The insulating plate 218 suppresses the transmission of the heat from the heater 207 to the seal cap 219. However, the embodiments are not limited thereto. For example, instead of the insulating plate 218, a heat insulating cylinder (not shown) may be provided under the boat 217 as a cylindrical part made of a heat resistant material such as quartz and SiC.

Figure 2:
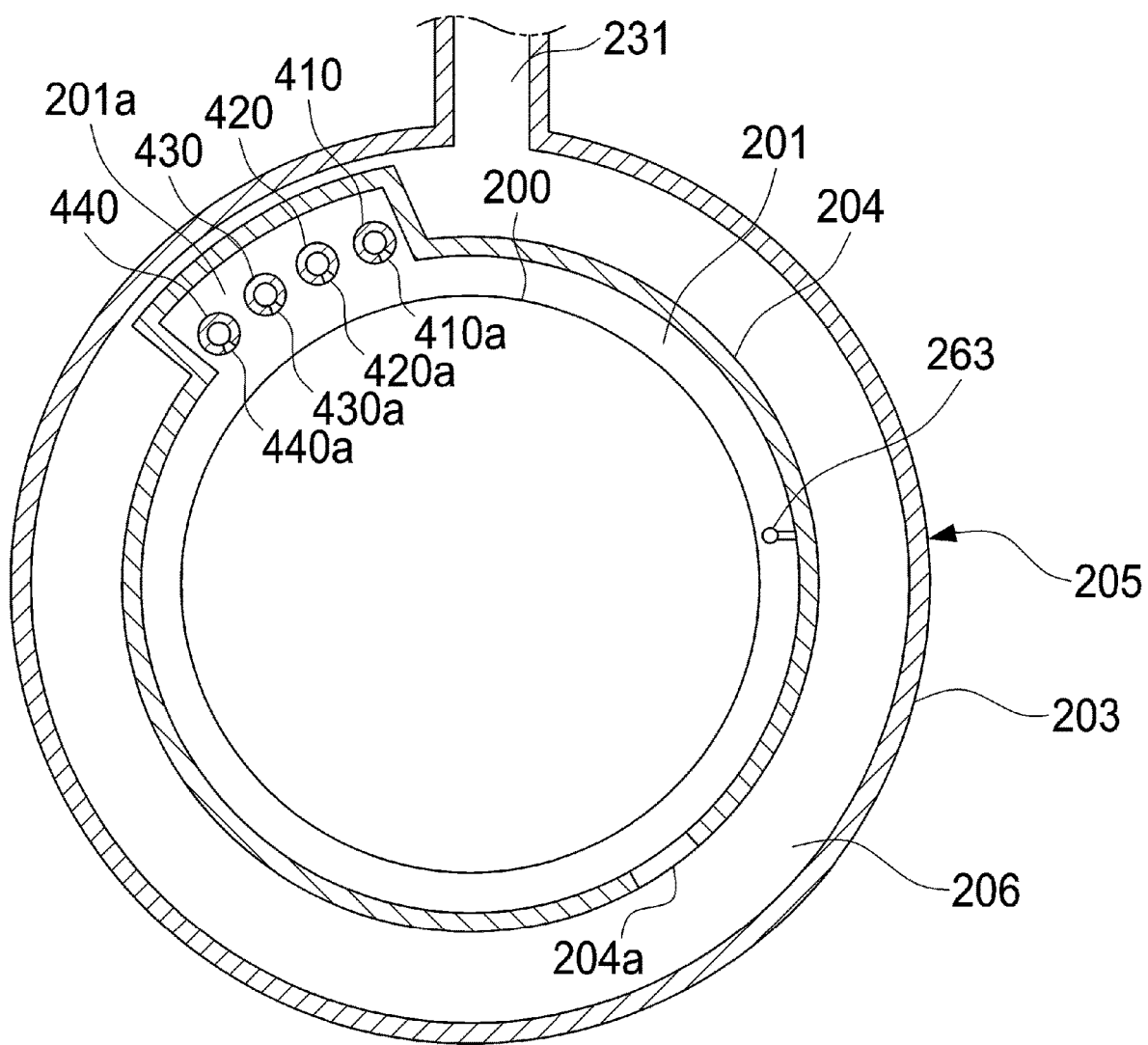
FIG. 2 schematically illustrates a cross-section taken along the line A-A of the process furnace of the substrate processing apparatus according to the embodiments shown in FIG. 1.

As shown in FIG. 2, a temperature sensor 263 serving as a temperature detector is installed in the inner tube 204. The amount of current supplied to the heater 207 is adjusted based on temperature information detected by the temperature sensor 263 such that the inner temperature of the process chamber 201 has a desired temperature distribution. The temperature sensor 263 is L-shaped like the nozzles 410, 420, 430 and 440, and is provided along the inner wall of the inner tube 204.

Figure 3:
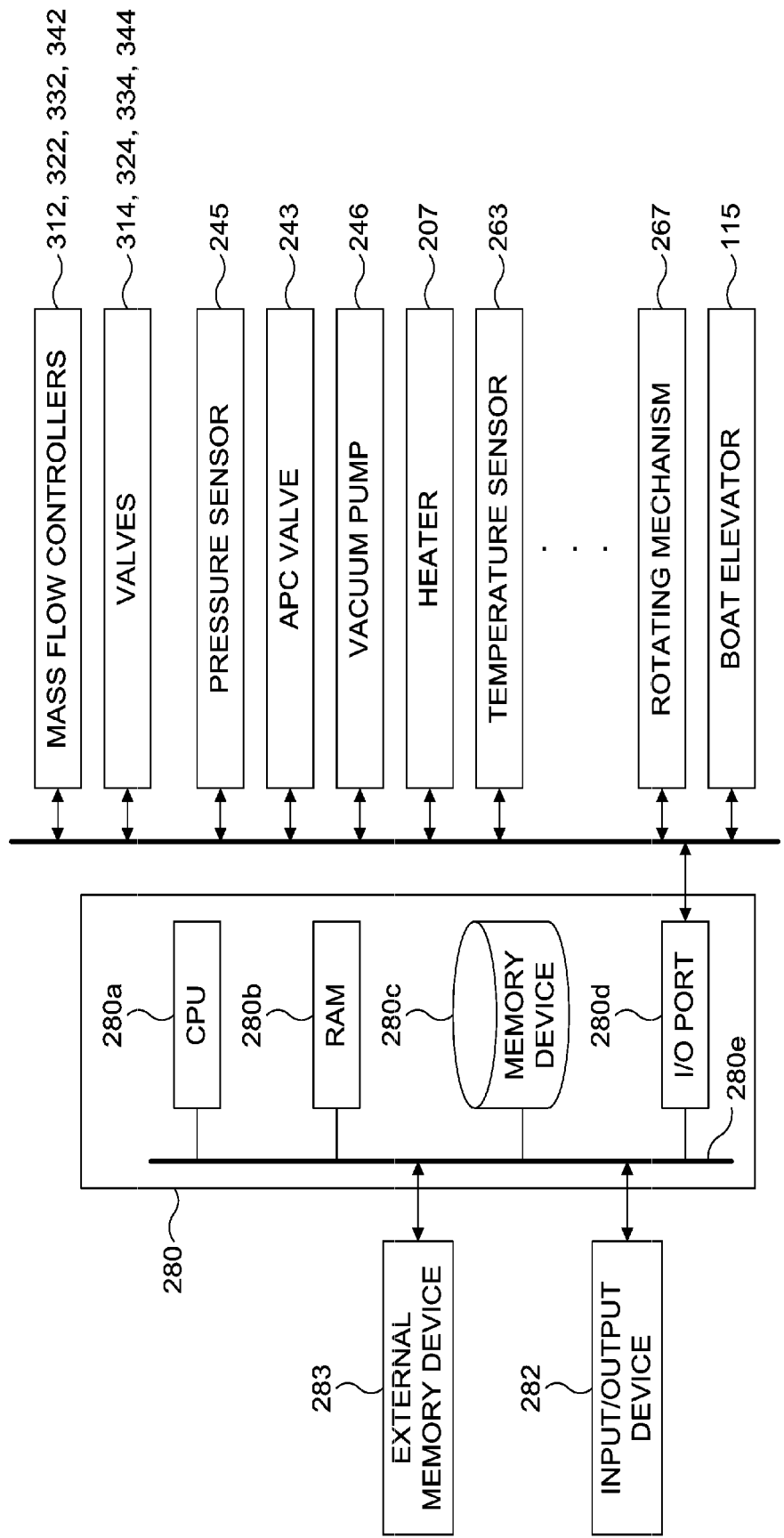
FIG. 3 is a block diagram schematically illustrating a configuration of a controller and related components of the substrate processing apparatus according to the embodiments.

As shown in FIG. 3, a controller 280 serving as a control device (control mechanism) is constituted by a computer including a CPU (Central Processing Unit) 280a, a RAM (Random Access Memory) 280b, a memory device 280c and an I/O port 280d. The RAM 280b, the memory device 280c and the I/O port 280d may exchange data with the CPU 280a through an internal bus 280e. For example, an input/output device 282 such as a touch panel is connected to the controller 280.

For example, the memory device 280c is configured by components such as a flash memory and HDD (Hard Disk Drive). A control program for controlling the operation of the substrate processing apparatus or a process recipe containing information on the sequences and conditions of the substrate processing (also referred to as a "film-forming process") described later is readably stored in the memory device 280c. The process recipe is obtained by combining steps of the substrate processing described later such that the controller 280 can execute the steps to acquire a predetermine result, and functions as a program. Hereinafter, the process recipe and the control program are collectively referred to as a "program". In the present specification, the term "program" may indicate only the process recipe, indicate only the control program, or indicate a combination of the process recipe and the control program. The RAM 280b functions as a memory area (work area) where a program or data read by the CPU 280a is temporarily stored.

The I/O port 280d is connected to the above-described components such as the MFCs 312, 322, 332, 342, 512, 522, 532 and 542, the valves 314, 324, 334, 342, 514, 524, 534 and 544, the pressure sensor 245, the APC valve 243, the vacuum pump 246, the heater 207, the temperature sensor 263, the rotating mechanism 267 and the boat elevator 115.

The CPU 280a is configured to read the control program from the memory device 280c and execute the read control program. Furthermore, the CPU 280a is configured to read a recipe such as the process recipe from the memory device 280c according to an operation command inputted from the input/output device 122. According to the contents of the read recipe, the CPU 280a may be configured to control various operations such as flow rate adjusting operations for various gases by the MFCs 312, 322, 332, 342, 512, 522, 532 and 542, opening/closing operations of the valves 314, 324, 334, 344, 514, 524, 534 and 544, an opening/closing operation of the APC valve 243, a pressure adjusting operation by the APC valve 243 based on the pressure sensor 245, a temperature adjusting operation of the heater 207 based on the temperature sensor 263, a start and stop of the vacuum pump 246, a rotation operation and rotation speed adjusting operation of the boat 217 by the rotating mechanism 267, an elevating and lowering operation of the boat 217 by the boat elevator 115, and a transport operation of the wafer 200 to the boat 217.

The controller 280 may be embodied by installing the above-described program stored in an external memory device 283 into a computer. For example, the external memory device 283 may include a magnetic tape, a magnetic disk such as a flexible disk and a hard disk, an optical disk such as a CD and a DVD, a magneto-optical disk such as an MO, and a semiconductor memory such as a USB memory and a memory card. The memory device 280c or the external memory device 283 may be embodied by a non-transitory computer readable recording medium. Hereafter, the memory device 280c and the external memory device 283 are collectively referred to as recording media. In the present specification, the term "recording media" may indicate only the memory device 280c, indicate only the external memory device 283, or indicate both of the memory device 280c and the external memory device 283. Instead of the external memory device 283, a communication means such as the Internet and a dedicated line may be used to provide the program to the computer.

(2) Substrate Processing (Film-Forming Process)

Figure 5:
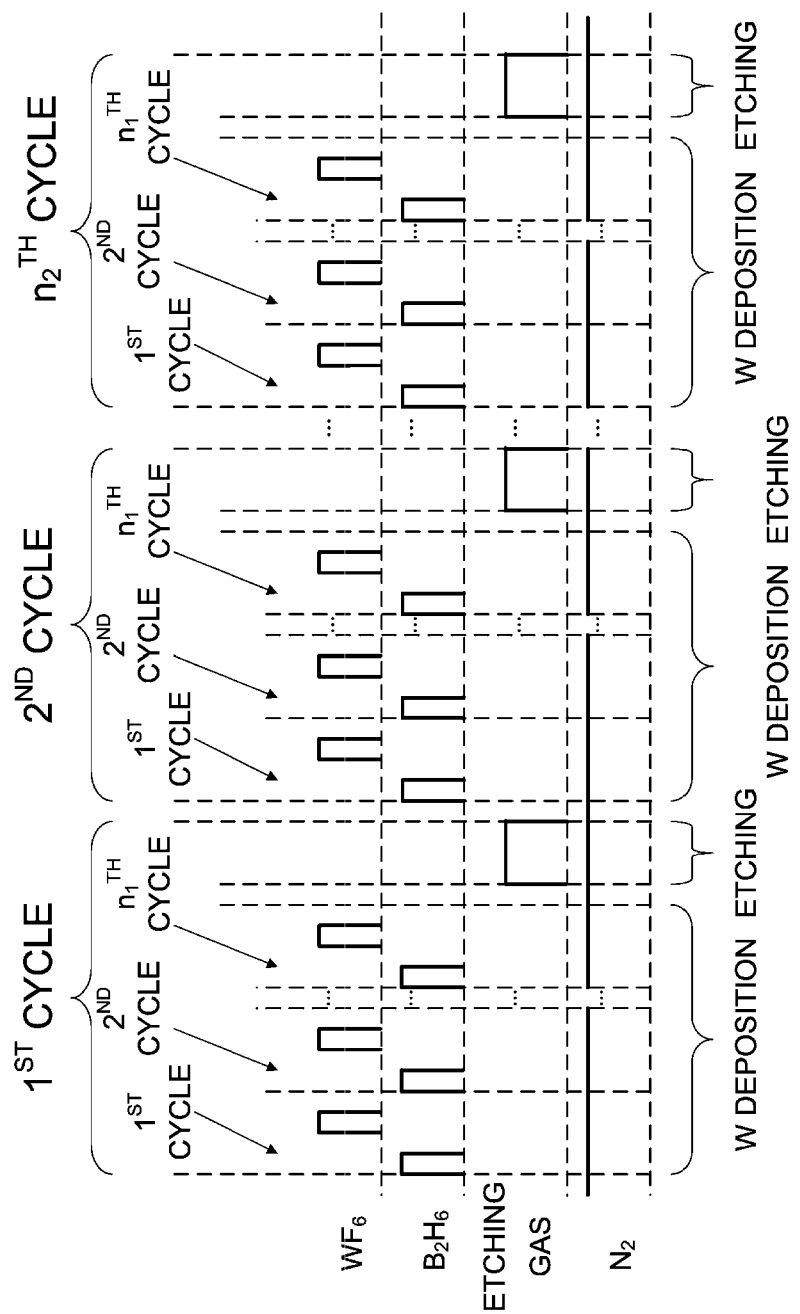
FIG. 5 is a timing diagram schematically illustrating a gas supply preferably used in a film-forming process according to a first embodiment described herein.

Hereinafter, an exemplary sequence of the substrate processing of growing a metal film selectively on a substrate (also referred to as a "selective growing process"), which is a part of manufacturing processes of a semiconductor device, will be described with reference to FIG. 5. The exemplary sequence of growing the metal film selectively on the substrate is performed by using the process furnace 202 of the substrate processing apparatus described above. Hereinafter, the operations of the components of the substrate processing apparatus are controlled by the controller 280.

In the present specification, the term "wafer" may refer to "a wafer itself" or refer to "a wafer and a stacked structure (aggregated structure) of predetermined layers or films formed on a surface of the wafer". In addition, the term "surface of wafer" refers to "a surface (exposed surface) of a wafer itself" or "a surface of a predetermined layer or film formed on the wafer, i.e. a top surface (uppermost surface) of the wafer as a stacked structure". In the present specification, the terms "substrate" and "wafer" may be used as substantially the same meaning.

<Wafer Charging and Boat Loading Step>

The boat 217 charged with the plurality of the wafers including the wafer 200 is loaded into the process chamber 201 (boat loading step). A titanium nitride film (TiN film) (also referred to as a "first metal film") and an insulating film such as an oxide and a silicon (Si) film, which has a longer incubation time than that on the first metal film, are formed (exposed) on top surfaces of the plurality of the wafers. Specifically, after the boat 217 is charged with the plurality of the wafers (wafer charging step), the boat 217 supporting the plurality of the wafers is elevated by the boat elevator 115 and loaded into the process chamber 201 as shown in FIG. 1. With the boat 217 loaded, the seal cap 219 seals the lower end opening of the reaction tube (that is, the outer tube 203) via the O-ring (not shown).

<Pressure and Temperature Adjusting Step>

The vacuum pump 246 vacuum-exhausts the process chamber 201 until the inner pressure of the process chamber 201 reaches a desired pressure (vacuum degree). In the pressure and temperature adjusting step, the inner pressure of the process chamber 201 is measured by the pressure sensor 245, and the APC valve 243 is feedback-controlled based on the measured pressure information (pressure adjusting step). The vacuum pump 246 is continuously operated until at least the processing of the wafer 200 is completed. The heater 207 heats the process chamber 201 such that the inner temperature of the process chamber 201 reaches a desired temperature. The amount of the current supplied to the heater 207 is feedback-controlled based on the temperature information detected by the temperature sensor 263 such that the inner temperature of the process chamber 201 has a desired temperature distribution (temperature adjusting step). The heater 207 continuously heats the process chamber 201 until at least the processing of the wafer 200 is completed.

Subsequently, the selective growing process of selectively growing a tungsten (W) film (also referred to as a "second metal film") on the titanium nitride film (TiN film) of the wafer 200 is performed. As described above, the TiN film (first metal film) and the insulating film such as the oxide and the silicon (Si) film, which has a longer incubation time than that on the first metal film, are formed (exposed) on the top surface of the wafer 200.

<Tungsten Layer Forming Process (W Deposition Process)>

First, a tungsten layer forming process of forming a tungsten layer serving as a metal layer on the wafer 200 is performed.

<$B_2H_6$ Gas Supplying Step>

The valve 314 is opened to supply the $B_2H_6$ gas serving as the boron-containing gas (first reducing gas) into the gas supply pipe 310. A flow rate of the $B_2H_6$ gas is adjusted by the MFC 312. The $B_2H_6$ gas with the flow rate thereof adjusted is supplied into the process chamber 201 through the plurality of gas supply holes 410a of the nozzle 410 to supply the $B_2H_6$ gas onto the wafer 200, and then is exhausted through the exhaust pipe 231. Simultaneously, the valve 514 is opened to supply the inert gas such as the $N_2$ gas into the gas supply pipe 510. A flow rate of the $N_2$ gas is adjusted by the MFC 512. The $N_2$ gas with the flow rate thereof adjusted is supplied with the $B_2H_6$ gas into the process chamber 201, and then is exhausted through the exhaust pipe 231. In order to prevent the $B_2H_6$ gas from entering the nozzles 420, 430 and 440, the valves 524, 534 and 544 are opened to supply the $N_2$ gas into the gas supply pipes 520, 530 and 540. The $N_2$ gas is supplied into the process chamber 201 through the gas supply pipes 320, 330 and 340 and the nozzles 420, 430 and 440, and then is exhausted through the exhaust pipe 231.

In the $B_2H_6$ gas supplying step, the APC valve 243 is appropriately controlled to adjust the inner pressure of the process chamber 201 to a predetermined pressure. For example, the predetermined pressure of the process chamber 201 may range from 10 Pa to 3,990 Pa. The flow rate of the $B_2H_6$ gas supplied into the process chamber 201 is adjusted by the MFC 312 to a predetermined flow rate. For example, the predetermined flow rate of the $B_2H_6$ gas may range from 0.01 slm to 20 slm. The flow rates of the $N_2$ gas supplied into the process chamber 201 are adjusted by the MFCs 512, 522, 532 and 542 to predetermined flow rates, respectively. For example, the predetermined flow rates of the $N_2$ gas supplied into the process chamber 201 may range from 0.01 slm to 30 slm, respectively. For example, the time duration (also referred to as a "supply time") of supplying the $B_2H_6$ gas onto the wafer 200 may be set to a predetermined time ranging from 0.01 second to 60 seconds. The temperature of the heater 207 is adjusted such that the temperature of the wafer 200 may become a predetermined temperature. For example, the predetermined temperature of the wafer 200 may range from 100° C. to 350° C. In the $B_2H_6$ gas supplying step, only the $B_2H_6$ gas and the $N_2$ gas are supplied into the process chamber 201. By supplying the $B_2H_6$ gas into the process chamber 201, the top surface of the wafer 200 is subject to reduction.

<First Residual Gas Removing Step>

After supplying the $B_2H_6$ gas supply for a predetermined time, the valve 314 is closed to stop the supply of the $B_2H_6$ gas. In the first residual gas removing step, with the APC valve 243 of the exhaust pipe 231 open, the vacuum pump 246 vacuum-exhausts the inner atmosphere of the process chamber 201 to remove a residual $B_2H_6$ gas in the process chamber 201 which did not react or which contributed to the reduction of the top surface of the wafer 200 from the process chamber 201. In the first residual gas removing step, by maintaining the valves 514, 524, 534 and 544 open, the $N_2$ gas is continuously supplied into the process chamber 201. The $N_2$ gas serves as a purge gas, which improves the efficiency of removing the residual $B_2H_6$ gas which did not react or which contributed to the reduction from the process chamber 201.

<$WF_6$ Gas Supplying Step>

The valve 324 is opened to supply the $WF_6$ gas serving as the metal-containing gas into the gas supply pipe 320. A flow rate of the $WF_6$ gas is adjusted by the MFC 322. The $WF_6$ gas with the flow rate thereof adjusted is supplied into the process chamber 201 through the plurality of the gas supply holes 420a of the nozzle 420 to supply the $WF_6$ gas onto the wafer 200, and then is exhausted through the exhaust pipe 231. Simultaneously, the valve 524 is opened to supply the inert gas such as the $N_2$ gas into the gas supply pipe 520. A flow rate of the $N_2$ gas is adjusted by the MFC 522. The $N_2$ gas with the flow rate thereof adjusted is supplied with the $WF_6$ gas into the process chamber 201, and then is exhausted through the exhaust pipe 231. In order to prevent the $WF_6$ gas from entering the nozzles 410, 430 and 440, the valves 514, 534 and 544 are opened to supply the $N_2$ gas into the gas supply pipes 510, 530 and 540. The $N_2$ gas is supplied into the process chamber 201 through the gas supply pipes 310, 330 and 340 and the nozzles 410, 430 and 440, and then is exhausted through the exhaust pipe 231.

In the WF$_6$ gas supplying step, the APC valve 243 is appropriately controlled to adjust the inner pressure of the process chamber 201 to a predetermined pressure. For example, the predetermined pressure of the process chamber 201 may range from 0.1 Pa to 6,650 Pa. The flow rate of the WF$_6$ gas supplied into the process chamber 201 is adjusted by the MFC 322 to a predetermined flow rate. For example, the predetermined flow rate of the WF$_6$ gas may range from 0.01 slm to 10 slm. The flow rates of the N$_2$ gas supplied into the process chamber 201 are adjusted by the MFCs 512, 522, 532 and 542 to predetermined flow rates, respectively. For example, the predetermined flow rates of the N$_2$ gas supplied into the process chamber 201 may range from 0.1 slm to 30 slm, respectively. For example, the time duration of supplying the WF$_6$ gas onto the wafer 200 may be set to a predetermined time ranging from 0.01 second to 600 seconds. The temperature of the heater 207 is adjusted such that the temperature of the wafer 200 may become the same predetermined temperature as that of the B$_2$H$_6$ gas supplying step.

In the WF$_6$ gas supplying step, only the WF$_6$ gas and the N$_2$ gas are supplied into the process chamber 201. By supplying the WF$_6$ gas into the process chamber 201, a tungsten (W) layer having a thickness of, for example, less than one atomic layer to several atomic layers is formed on the wafer 200.

<Second Residual Gas Removing Step>

After forming the tungsten layer, the valve 324 is closed to stop the supply of the WF$_6$ gas. In the second residual gas removing step, the inner atmosphere of the process chamber 201 is vacuum-exhausted to remove a residual WF$_6$ gas in the process chamber 201 which did not react or which contributed to the formation of the tungsten layer from the process chamber 201 in the same manners as in the first residual gas removing step.

<Performing a Predetermined Number of Times>

By performing a cycle wherein the B$_2$H$_6$ gas supplying step, the first residual gas removing step, the WF$_6$ gas supplying step and the second residual gas removing step are performed sequentially at least once, that is, a predetermined number of times (n$_1$ times, n$_1$ is a natural number equal to or greater than 1), a tungsten layer having a predetermined thickness (for example, from 0.1 nm to 4.0 nm) is formed on the TiN film of the wafer 200. It is preferable that the cycle is performed a plurality of times.

<Etching Process>

Subsequently, an etching process of etching the tungsten layer formed on the insulating film of the wafer 200 is performed.

<NF$_3$ Gas Supplying Step>

The valve 334 is opened to supply the NF$_3$ gas serving as the etching gas into the gas supply pipe 330. A flow rate of the NF$_3$ gas is adjusted by the MFC 332. The NF$_3$ gas with the flow rate thereof adjusted is supplied into the process chamber 201 through the plurality of the gas supply holes 430a of the nozzle 430 to supply the NF$_3$ gas onto the wafer 200, and then is exhausted through the exhaust pipe 231. Simultaneously, the valve 534 is opened to supply the inert gas such as the N$_2$ gas into the gas supply pipe 530. A flow rate of the N$_2$ gas is adjusted by the MFC 532. The N$_2$ gas with the flow rate thereof adjusted is supplied with the NF$_3$ gas into the process chamber 201, and then is exhausted through the exhaust pipe 231. In order to prevent the NF$_3$ gas from entering the nozzles 410, 420 and 440, the valves 514, 524 and 544 are opened to supply the N$_2$ gas into the gas supply pipes 510, 520 and 540. The N$_2$ gas is supplied into the process chamber 201 through the gas supply pipes 310, 320 and 340 and the nozzles 410, 420 and 440, and then is exhausted through the exhaust pipe 231.

In the NF$_3$ gas supplying step, the APC valve 243 is appropriately controlled to adjust the inner pressure of the process chamber 201 to a predetermined pressure. For example, the predetermined pressure of the process chamber 201 may range from 0 Pa to 100 Pa. Preferably, the predetermined pressure of the process chamber 201 of the NF$_3$ gas supplying step is lower than that of the tungsten layer forming process, that is, those of the B$_2$H$_6$ gas supplying step and the WF$_6$ gas supplying step. The flow rate of the NF$_3$ gas supplied into the process chamber 201 is adjusted by the MFC 332 to a predetermined flow rate. For example, the predetermined flow rate of the NF$_3$ gas may range from 0.01 slm to 1 slm. The flow rates of the N$_2$ gas supplied into the process chamber 201 are adjusted by the MFCs 512, 522, 532 and 542 to predetermined flow rates, respectively. For example, the predetermined flow rates of the N$_2$ gas supplied into the process chamber 201 may range from 1 slm to 5 slm, respectively. For example, the time duration of supplying the NF$_3$ gas onto the wafer 200 may be set to a predetermined time ranging from 30 seconds to 600 seconds. The temperature of the heater 207 is adjusted such that the temperature of the wafer 200 may become a predetermined temperature. For example, the predetermined temperature of the wafer 200 may range from 100° C. to 500° C. Preferably, the predetermined temperature of the wafer 200 of the NF$_3$ gas supplying step is lower than that of the tungsten layer forming process, that is, those of the B$_2$H$_6$ gas supplying step and the WF$_6$ gas supplying step.

In the NF$_3$ gas supplying step, the tungsten layer formed on the wafer 200 is etched by the NF$_3$ gas. Because of the difference in the incubation time, the tungsten layer formed on the TiN film on the wafer 200 is thicker than the tungsten layer formed on the insulating film on the wafer 200. Therefore, even after the tungsten layer formed on the insulating film is etched, the tungsten layer remains on the TiN film by a predetermined thickness. When the tungsten layer formed on the insulating film is etched, the supply of the NF$_3$ gas is stopped.

<Third Residual Gas Removing Step>

After etching the tungsten layer, the valve 324 is closed to stop the supply of the NF$_3$ gas. In the third residual gas removing step, the inner atmosphere of the process chamber 201 is vacuum-exhausted to remove a residual NF$_3$ gas in the process chamber 201 which did not react or which contributed to the etching of the tungsten layer from the process chamber 201 in the same manners as in the first residual gas removing step.

<Performing a Predetermined Number of Times>

By performing a cycle wherein the tungsten layer forming process and the etching process are performed sequentially at least once, that is, a predetermined number of times (n$_2$ times, n$_2$ is a natural number equal to or greater than 1), a tungsten film having a predetermined thickness (for example, from 2 nm to 20 nm) is selectively grown on the TiN film of the wafer 200. It is preferable that the cycle is performed a plurality of times.

<Purging and Returning to Atmospheric Pressure Step>

The N$_2$ gas is supplied into the process chamber 201 through each of the gas supply pipes 510, 520, 530 and 540, and then is exhausted through the exhaust pipe 231. The N$_2$ gas serves as the purge gas. The process chamber 201 is thereby purged such that the residual gas or the by-products remaining in the process chamber 201 are removed from the process chamber 201 (purging step). Thereafter, the inner atmosphere of the process chamber 201 is replaced with the inert gas (replacing with inert gas), and the inner pressure of the process chamber 201 is returned to an atmospheric pressure (returning to atmospheric pressure).

<Boat Unloading and Wafer Discharging Step>

Thereafter, the seal cap 219 is lowered by the boat elevator 115 and the lower end of the reaction tube (that is, the outer tube 203) is opened. The boat 217 with the plurality of the processed wafers including the wafer 200 charged therein is transferred (unloaded) out of the outer tube 203 through the lower end of the outer tube 203 (boat unloading step). Then, the plurality of the processed wafers including the wafer 200 is discharged from the boat 217 (wafer discharging step).

(3) Effects According to First Embodiment

According to the first embodiment, it is possible to provide at least one or more of the following effects.

(a) By alternately performing the tungsten layer forming process and the etching process, it is possible to selectively grow the tungsten film with the high selectivity only on the metal film of the substrate (wafer) on which the metal film and the insulating film are formed.

(b) By performing the etching process at a lower temperature and a lower pressure than the tungsten layer forming process, it is possible to improve the controllability of the etching process, and is also possible to selectively grow the tungsten film with the high selectivity only on the metal film of the substrate (wafer) on which the metal film and the insulating film are formed.

FIRST MODIFIED EXAMPLE

Figure 6:
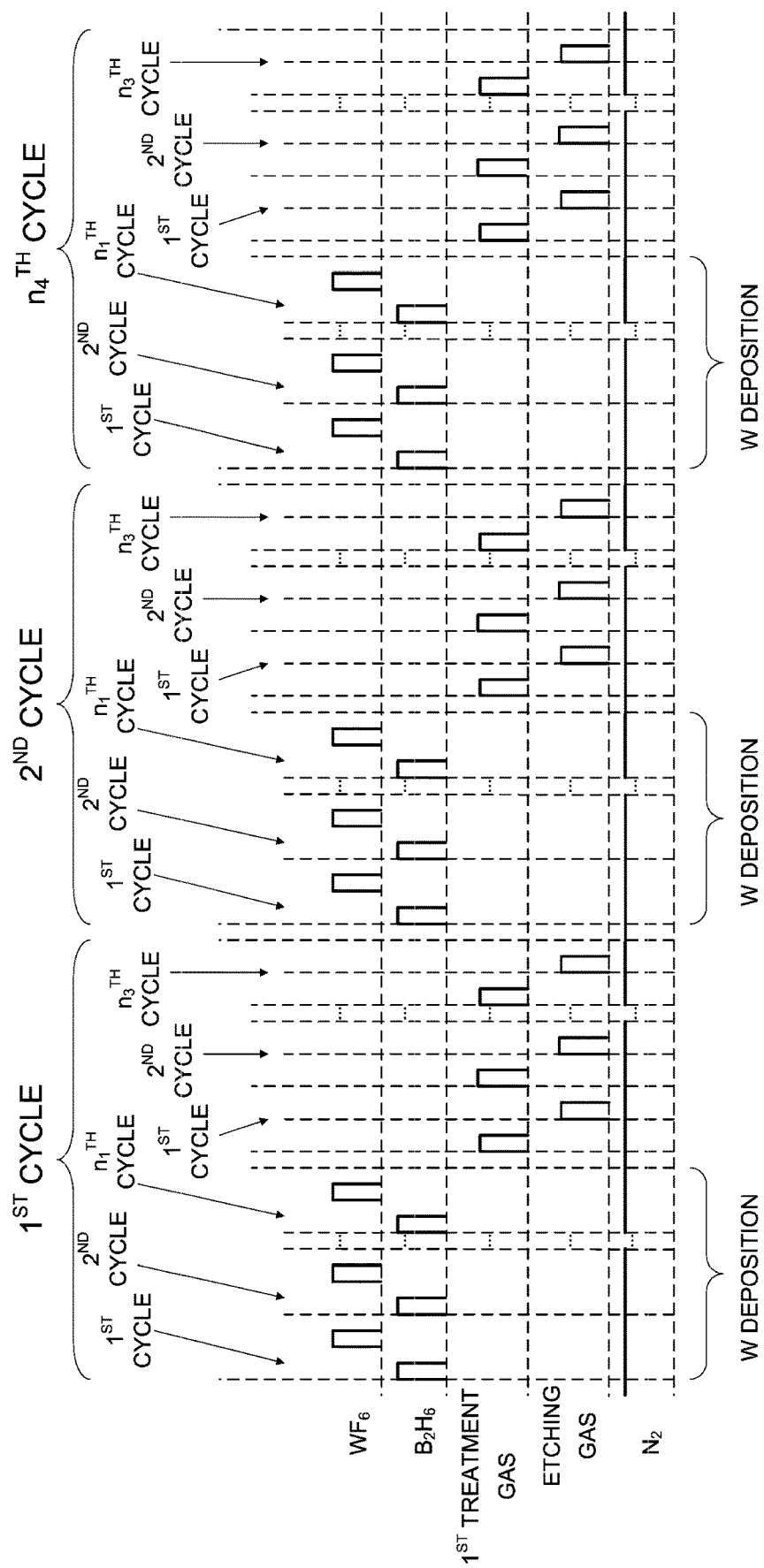
FIG. 6 is a timing diagram schematically illustrating a gas supply preferably used in a film-forming process according to a first modified example of the first embodiment described herein.

A first modified example of the first embodiment will be described with reference to FIG. 6. In the first modified example, only portions different from those of the first embodiment will be described in detail below, and the description of portions the same as the first embodiment will be omitted.

The difference between the first modified example and the first embodiment is mainly that the pre-treatment step is performed before the $NF_3$ gas supplying step is performed in the etching process. Hereinafter, the pre-treatment step will be described below.

<Pre-Treatment Step ($O_3$ Gas Supplying Step)>

The valve 344 is opened to supply the $O_3$ gas serving as the modifying gas (oxidizing gas) into the gas supply pipe 340. The modifying gas such as the $O_3$ gas may also be referred to as a "first treatment gas". A flow rate of the $O_3$ gas is adjusted by the MFC 342. The $O_3$ gas with the flow rate thereof adjusted is supplied into the process chamber 201 through the plurality of the gas supply holes 440a of the nozzle 440 to supply the $O_3$ gas onto the wafer 200, and then is exhausted through the exhaust pipe 231. Simultaneously, the valve 544 is opened to supply the inert gas such as the $N_2$ gas into the gas supply pipe 540. A flow rate of the $N_2$ gas is adjusted by the MFC 542. The $N_2$ gas with the flow rate thereof adjusted is supplied with the $O_3$ gas into the process chamber 201, and then is exhausted through the exhaust pipe 231. In order to prevent the $O_3$ gas from entering the nozzles 410, 420 and 430, the valves 514, 524 and 534 are opened to supply the $N_2$ gas into the gas supply pipes 510, 520 and 530. The $N_2$ gas is supplied into the process chamber 201 through the gas supply pipes 310, 320 and 330 and the nozzles 410, 420 and 430, and then is exhausted through the exhaust pipe 231.

In the $O_3$ gas supplying step, the APC valve 243 is appropriately controlled to adjust the inner pressure of the process chamber 201 to a predetermined pressure. For example, the predetermined pressure of the process chamber 201 may range from 50 Pa to 500 Pa. The flow rate of the $O_3$ gas supplied into the process chamber 201 is adjusted by the MFC 342 to a predetermined flow rate. For example, the predetermined flow rate of the $O_3$ gas may range from 0.1 slm to 3 slm. The flow rates of the $N_2$ gas supplied into the process chamber 201 are adjusted by the MFCs 512, 522, 532 and 542 to predetermined flow rates, respectively. For example, the predetermined flow rates of the $N_2$ gas supplied into the process chamber 201 may range from 0.1 slm to 3 slm, respectively. For example, the time duration of supplying the $O_3$ gas onto the wafer 200 may be set to a predetermined time ranging from 200 seconds to 2,000 seconds. The temperature of the heater 207 is adjusted such that the temperature of the wafer 200 may become a predetermined temperature. For example, the predetermined temperature of the wafer 200 may range from 100° C. to 400° C. In the $O_3$ gas supplying step, the tungsten layer formed on the wafer 200 is modified (oxidized) by the $O_3$ gas.

<Fourth Residual Gas Removing Step>

After sufficiently modifying the tungsten layer, the valve 344 is closed to stop the supply of the $O_3$ gas. In the fourth residual gas removing step, the inner atmosphere of the process chamber 201 is vacuum-exhausted to remove a residual $O_3$ gas in the process chamber 201 which did not react or which contributed to the modification of the tungsten layer from the process chamber 201 in the same manners as in the first residual gas removing step.

Thereafter, the above-described $NF_3$ gas supplying step and the third residual gas removing step are performed.

<Performing a Predetermined Number of Times>

By performing a cycle wherein the $O_3$ gas supplying step, the fourth residual gas removing step, the $NF_3$ gas supplying step and the third residual gas removing step are performed sequentially at least once, that is, a predetermined number of times ($n_3$ times, $n_3$ is a natural number equal to or greater than 1), the tungsten layer formed on the insulating film is etched.

By performing a cycle wherein the tungsten layer forming process and the etching process of the first modified example are performed sequentially at least once, that is, a predetermined number of times ($n_4$ times, $n_4$ is a natural number equal to or greater than 1), the above-described tungsten film having the predetermined thickness is selectively grown on the TiN film of the wafer 200. It is preferable that the cycle is performed a plurality of times. While the pre-treatment step is described by way of an example in which the $O_3$ gas is used as the modifying gas (oxidizing gas), the pre-treatment step is not limited thereto. For example, a nitriding gas serving as the modifying gas may be used to modify (nitride) the tungsten layer. For example, ammonia ($NH_3$) gas may be used as the nitriding gas.

(4) Effects According to First Modified Example

According to the first modified example, it is possible to provide the following effect in addition to the effects (a) and (b) of the first embodiment described above.

(c) By modifying (oxidizing) the tungsten layer, it is possible to lower an etching temperature required for the etching process. Therefore, it is possible to further improve the efficiency and the controllability of the etching process.

SECOND MODIFIED EXAMPLE

Figure 7:
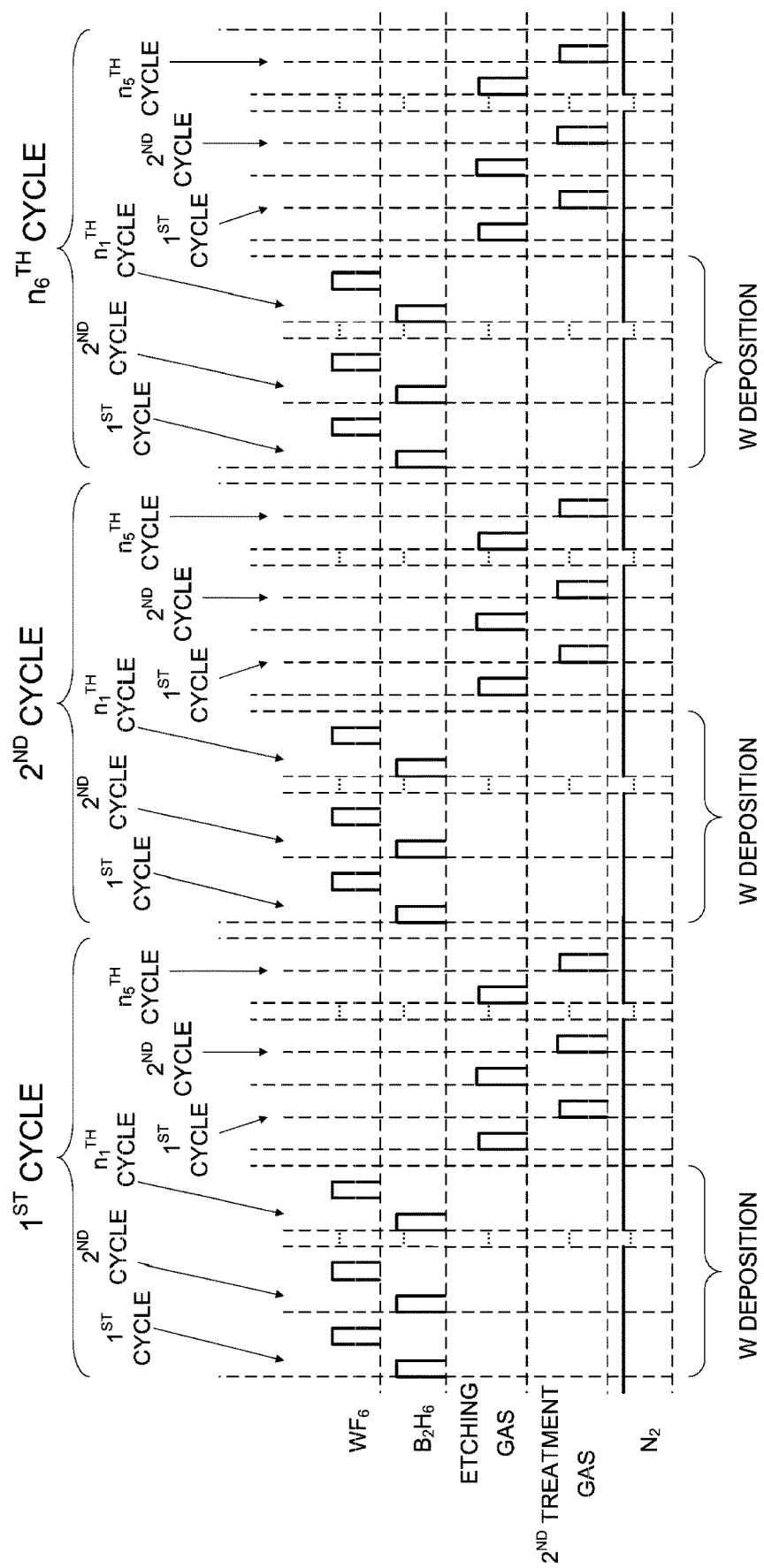
FIG. 7 is a timing diagram schematically illustrating a gas supply preferably used in a film-forming process according to a second modified example of the first embodiment described herein.

A second modified example of the first embodiment will be described with reference to FIG. 7. In the second modified example, only portions different from those of the first embodiment will be described in detail below, and the description of portions the same as the first embodiment will be omitted.

The difference between the second modified example and the first embodiment is mainly that the post-treatment step is performed after the $NF_3$ gas supplying step is performed in the etching process. Hereinafter, the post-treatment step will be described below.

<Post-Treatment Step ($H_2$ Gas Supplying Step)>

The valve 314 is opened to supply the $H_2$ gas serving as the second reducing gas into the gas supply pipe 310. The second reducing gas such as the $H_2$ gas may also be referred to as a "second treatment gas". A flow rate of the $H_2$ gas is adjusted by the MFC 312. The $H_2$ gas with the flow rate thereof adjusted is supplied into the process chamber 201 through the plurality of the gas supply holes 410a of the nozzle 410 to supply the $H_2$ gas onto the wafer 200, and then is exhausted through the exhaust pipe 231. Simultaneously, the valve 514 is opened to supply the inert gas such as the $N_2$ gas into the gas supply pipe 510. A flow rate of the $N_2$ gas is adjusted by the MFC 512. The $N_2$ gas with the flow rate thereof adjusted is supplied with the $H_2$ gas into the process chamber 201, and then is exhausted through the exhaust pipe 231. In order to prevent the $O_3$ gas from entering the nozzles 420, 430 and 440, the valves 524, 534 and 544 are opened to supply the $N_2$ gas into the gas supply pipes 520, 530 and 540. The $N_2$ gas is supplied into the process chamber 201 through the gas supply pipes 320, 330 and 340 and the nozzles 420, 430 and 440, and then is exhausted through the exhaust pipe 231.

In the $H_2$ gas supplying step, the APC valve 243 is appropriately controlled to adjust the inner pressure of the process chamber 201 to a predetermined pressure. For example, the predetermined pressure of the process chamber 201 may range from 500 Pa to 2,000 Pa. The flow rate of the $H_2$ gas supplied into the process chamber 201 is adjusted by the MFC 312 to a predetermined flow rate. For example, the predetermined flow rate of the $H_2$ gas may range from 0.5 slm to 3 slm. The flow rates of the $N_2$ gas supplied into the process chamber 201 are adjusted by the MFCs 512, 522, 532 and 542 to predetermined flow rates, respectively. For example, the predetermined flow rates of the $N_2$ gas supplied into the process chamber 201 may range from 0.5 slm to 3 slm, respectively. For example, the time duration of supplying the $H_2$ gas onto the wafer 200 may be set to a predetermined time ranging from 1,800 seconds to 7,200 seconds. The temperature of the heater 207 is adjusted such that the temperature of the wafer 200 may become a predetermined temperature. For example, the predetermined temperature of the wafer 200 may range from 100° C. to 400° C. In the $H_2$ gas supplying step, the tungsten layer formed on the TiN film of the wafer 200 is modified (reduced) by the $H_2$ gas.

<Fifth Residual Gas Removing Step>

After sufficiently modifying the tungsten layer, the valve 314 is closed to stop the supply of the $H_2$ gas. In the fifth residual gas removing step, the inner atmosphere of the process chamber 201 is vacuum-exhausted to remove a residual $H_2$ gas in the process chamber 201 which did not react or which contributed to the modification of the tungsten layer from the process chamber 201 in the same manners as in the first residual gas removing step.

<Performing a Predetermined Number of Times>

By performing a cycle wherein the $NF_3$ gas supplying step, the third residual gas removing step, the $H_2$ gas supplying step and the fifth residual gas removing step are performed sequentially at least once, that is, a predetermined number of times ($n_5$ times, $n_5$ is a natural number equal to or greater than 1), the tungsten layer formed on the insulating film is etched.

<Performing a Predetermined Number of Times>

By performing a cycle wherein the tungsten layer forming process and the etching process of the second modified example are performed sequentially at least once, that is, a predetermined number of times ($n_6$ times, $n_6$ is a natural number equal to or greater than 1), the above-described tungsten film having the predetermined thickness is selectively grown on the TiN film of the wafer 200. It is preferable that the cycle is performed a plurality of times.

(5) Effects According to Second Modified Example

According to the second modified example, it is possible to provide the following effect in addition to the effects (a) and (b) of the first embodiment described above.

(d) By supplying the etching gas and modifying the tungsten layer alternately, it is possible to further improve the efficiency and the controllability of the etching process.

THIRD MODIFIED EXAMPLE

Figure 8:
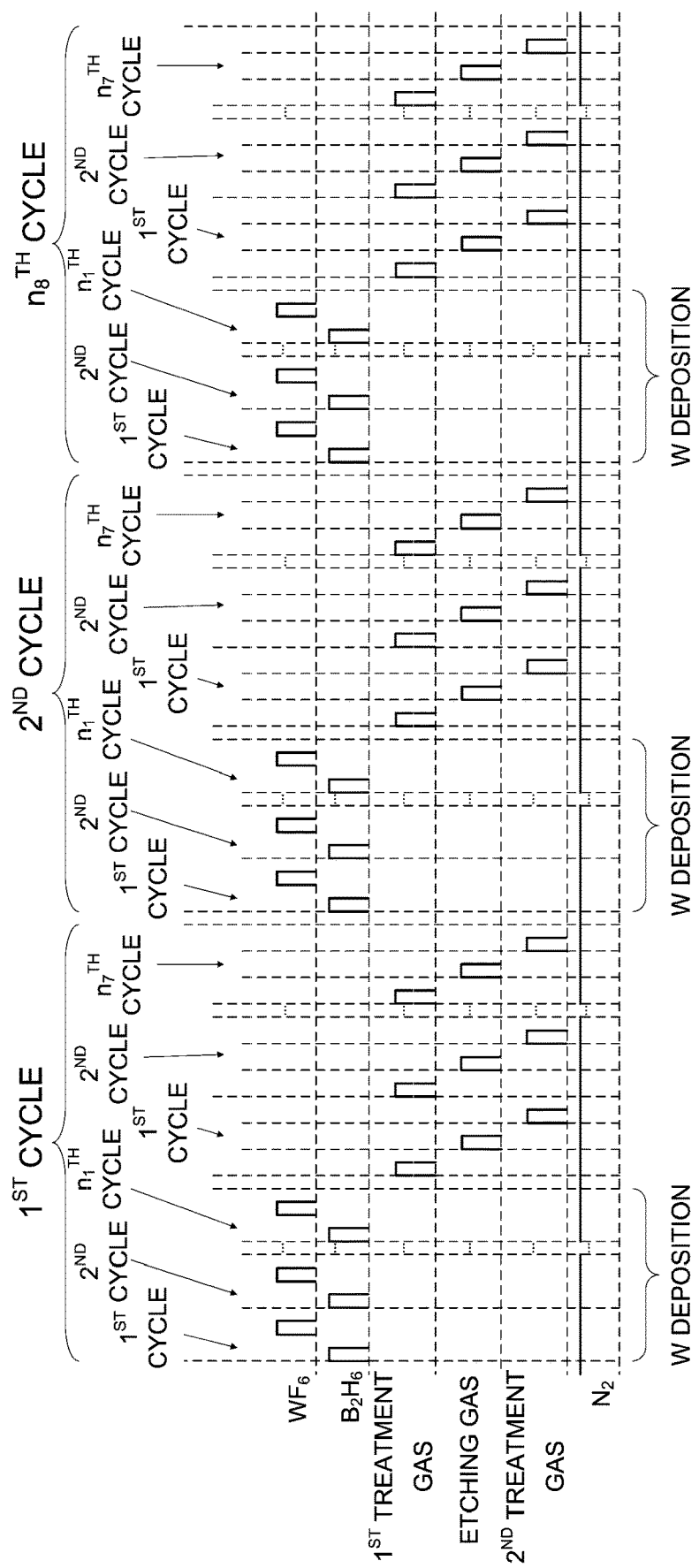
FIG. 8 is a timing diagram schematically illustrating a gas supply preferably used in a film-forming process according to a third modified example of the first embodiment described herein.

A third modified example of the first embodiment will be described with reference to FIG. 8. In the third modified example, only portions different from those of the first embodiment or the modified examples will be described in detail below, and the description of portions the same as the first embodiment or the modified examples will be omitted.

The third modified example is a combination of the first modified example and the second modified example. That is, according to the third modified example, the pre-treatment step of the first modified example is performed before the $NF_3$ gas supplying step is performed in the etching process and the post-treatment step of the second modified example is performed after the $NF_3$ gas supplying step is performed in the etching process.

By performing a cycle wherein the $O_3$ gas supplying step, the fourth residual gas removing step, the $NF_3$ gas supplying step, the third residual gas removing step, the $H_2$ gas supplying step and the fifth residual gas removing step are performed sequentially at least once, that is, a predetermined number of times ($n_7$ times, $n_7$ is a natural number equal to or greater than 1), the tungsten layer formed on the insulating film is etched.

By performing a cycle wherein the tungsten layer forming process and the etching process of the third modified example are performed sequentially at least once, that is, a predetermined number of times ($n_8$ times, $n_8$ is a natural number equal to or greater than 1), the above-described tungsten film having the predetermined thickness is selectively grown on the TiN film of the wafer 200. It is preferable that the cycle is performed a plurality of times.

(6) Effects According to Third Modified Example

According to the third modified example, it is possible to provide the effects (c) and (d) described above in addition to the effects (a) and (b) of the first embodiment described above.

FOURTH MODIFIED EXAMPLE

Figure 9:
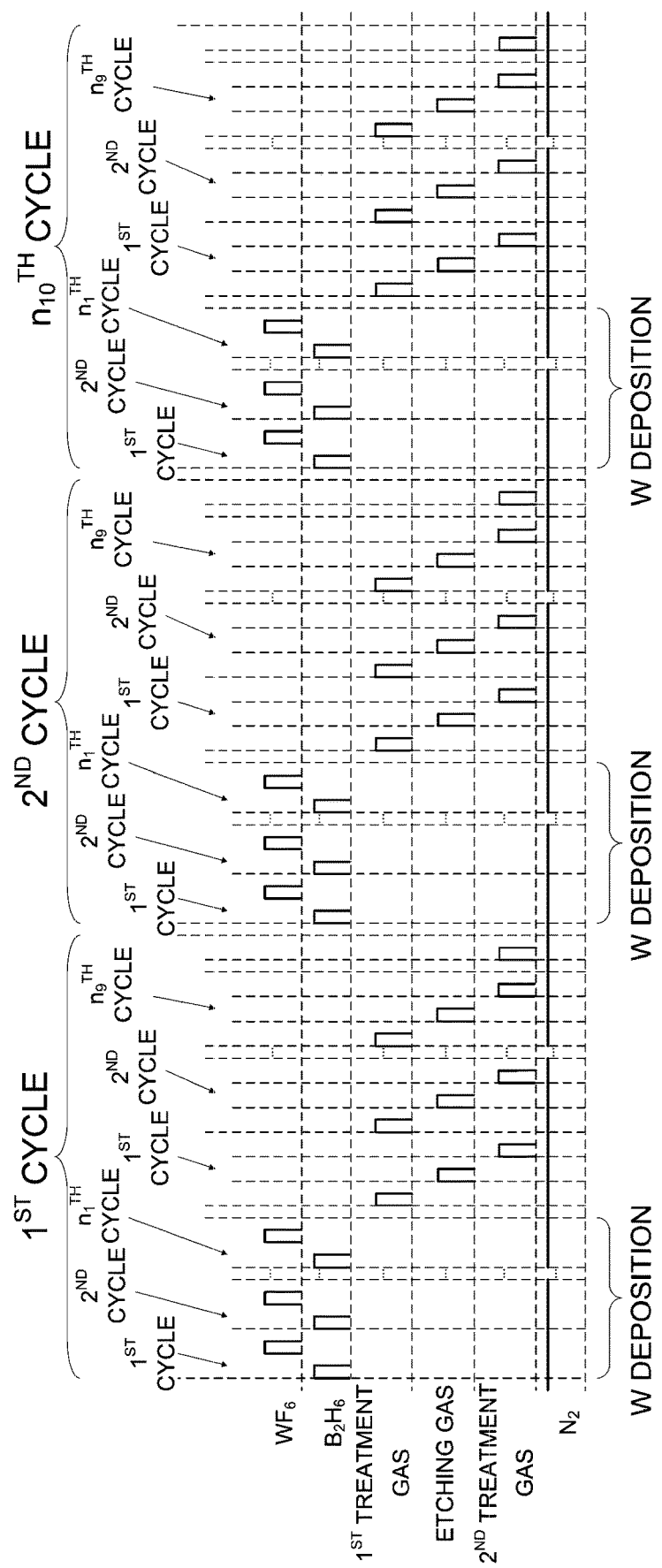
FIG. 9 is a timing diagram schematically illustrating a gas supply preferably used in a film-forming process according to a fourth modified example of the first embodiment described herein.

A fourth modified example of the first embodiment will be described with reference to FIG. 9. In the fourth modified example, only portions different from those of the first embodiment or the modified examples will be described in detail below, and the description of portions the same as the first embodiment or the modified examples will be omitted.

The difference between the fourth modified example and the third modified example is mainly that, according to an etching process of the fourth modified example, a post-treatment step is performed again after the etching process of the third modified example is performed. Parameters such as the processing conditions of the post-treatment step of the fourth modified example are the same as those of the post-treatment step of the third modified example described above, and descriptions thereof will be omitted.

(7) Effects According to Fourth Modified Example

According to the fourth modified example, it is possible to provide the following effect in addition to the effects (a), (b) (c) and (d) described above.

(e) By modifying the tungsten layer again at the end of the etching process, it is possible to efficiently form a tungsten layer in the next tungsten layer forming process.

Second Embodiment

Figure 10:
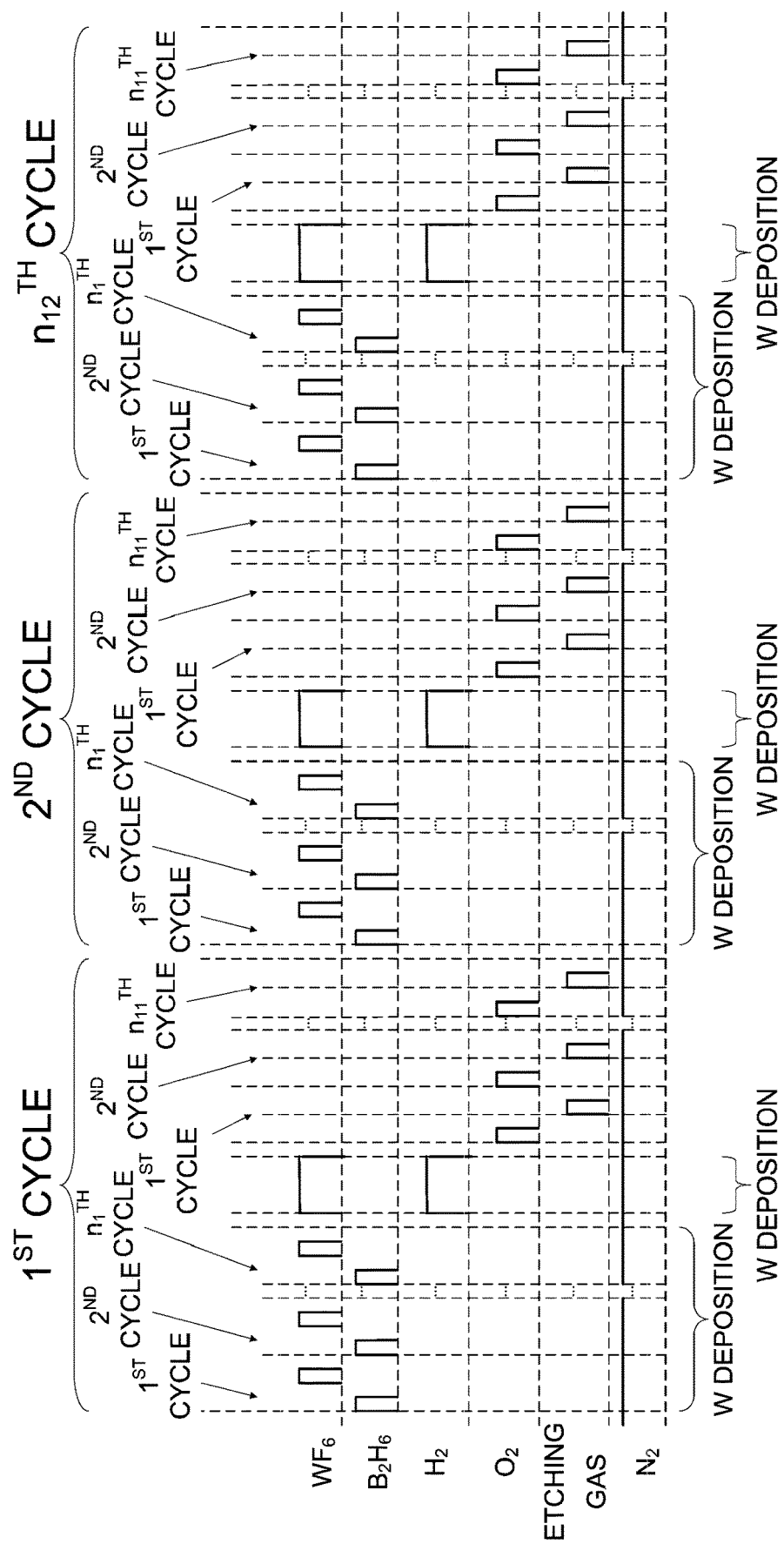
FIG. 10 is a timing diagram schematically illustrating a gas supply preferably used in a film-forming process according to a second embodiment described herein.

Hereinafter, a second embodiment according to the technique of the present disclosure will be described with reference to FIG. 10. In the second embodiment, only portions different from those of the first embodiment or the modified examples will be described in detail below, and the description of portions the same as the first embodiment or the modified examples will be omitted.

A tungsten layer forming process according to the second embodiment includes two processes, that is, a tungsten nucleus layer forming process and a tungsten bulk layer forming process. In order to ensure the adhesion to the underlying TiN film, a tungsten nucleus layer is formed first in the tungsten nucleus layer forming process, and then a tungsten bulk layer is formed using the tungsten nucleus layer as the nucleus in the tungsten bulk layer forming process described later. Specifically, the tungsten nucleus layer forming process corresponds to the tungsten layer forming process described in the first embodiment, and a tungsten layer formed in the tungsten nucleus layer forming process is also referred to as the tungsten nucleus layer. The tungsten bulk layer forming process will be described below.

<Tungsten Bulk Layer Forming Process (Bulk W Deposition Process)>

After the tungsten nucleus layer is formed, the tungsten bulk layer forming process of forming the tungsten bulk layer serving as a metal bulk layer is performed.

<$H_2$ Gas and $WF_6$ Gas Supplying Step>

The valves 314 and 324 are opened to supply the $H_2$ gas and the $WF_6$ gas into the gas supply pipes 310 and 320, respectively. Flow rates of the $H_2$ gas and the $WF_6$ gas are adjusted by the MFCs 312 and 322, respectively. The $H_2$ gas and the $WF_6$ gas with the flow rates thereof adjusted are supplied into the process chamber 201 through the plurality of the gas supply holes 410a of the nozzle 410 and the plurality of the gas supply holes 420a of the nozzle 420 to supply the $H_2$ gas and the $WF_6$ gas onto the wafer 200, respectively, and then are exhausted through the exhaust pipe 231. That is, the surface of the wafer 200 is exposed to the $H_2$ gas and the $WF_6$ gas. Simultaneously, the valves 514 and 524 are opened to supply the inert gas such as the $N_2$ gas into the gas supply pipes 510 and 520, respectively. Flow rates of the $N_2$ gas are adjusted by the MFCs 512 and 522, respectively. The $N_2$ gas with the flow rate thereof adjusted is supplied with the $H_2$ gas and the $WF_6$ gas into the process chamber 201, and then is exhausted through the exhaust pipe 231. In order to prevent the $H_2$ gas and the $WF_6$ gas s from entering the nozzles 430 and 440, the valves 534 and 544 are opened to supply the $N_2$ gas into the gas supply pipes 530 and 540. The $N_2$ gas is supplied into the process chamber 201 through the gas supply pipes 330 and 340 and the nozzles 430 and 440, and then is exhausted through the exhaust pipe 231.

In the $H_2$ gas and $WF_6$ gas supplying step, the APC valve 243 is appropriately controlled to adjust the inner pressure of the process chamber 201 to a predetermined pressure. For example, the predetermined pressure of the process chamber 201 may range from 10 Pa to 3,990 Pa. The flow rate of the $H_2$ gas supplied into the process chamber 201 is adjusted by the MFC 312 to a predetermined flow rate. For example, the predetermined flow rate of the $H_2$ gas may range from 100 sccm to 20,000 sccm. The flow rate of the $WF_6$ gas supplied into the process chamber 201 is adjusted by the MFC 322 to a predetermined flow rate. For example, the predetermined flow rate of the $WF_6$ gas may range from 10 sccm to 1,000 sccm. The flow rates of the $N_2$ gas supplied into the process chamber 201 are adjusted by the MFCs 512, 522, 532 and 542 to predetermined flow rates, respectively. For example, the predetermined flow rates of the $N_2$ gas supplied into the process chamber 201 may range from 10 sccm to 10,000 sccm, respectively. For example, the time duration of supplying the $H_2$ gas and the $WF_6$ gas onto the wafer 200 (that is, the gas supply time or the irradiation time), may be set to a predetermined time ranging from 1 second to 1,000 seconds. The temperature of the heater 207 is adjusted such that the temperature of the wafer 200 may become a predetermined temperature. For example, the predetermined temperature of the wafer 200 may range from 100° C. to 600° C. In the $H_2$ gas and $WF_6$ gas supplying step, only the $H_2$ gas and the $WF_6$ gas are supplied into the process chamber 201. By supplying the $WF_6$ gas into the process chamber 201, a tungsten bulk layer having a thickness of, for example, from 10 nm to 30 nm, is formed on the tungsten nucleus layer on the wafer 200.

<Sixth Residual Gas Removing Step>

After forming the tungsten bulk layer, the valves 312 and 322 are closed to stop the supply of the $H_2$ gas and the $WF_6$ gas. In the sixth residual gas removing step, with the APC valve 243 of the exhaust pipe 231 open, the vacuum pump 246 vacuum-exhausts the inner atmosphere of the process chamber 201 to remove a residual $H_2$ gas and a residual $WF_6$ in the process chamber 201 which did not react or which contributed to the formation of the tungsten bulk layer from the process chamber 201. In the sixth residual gas removing step, by maintaining the valves 514, 524, 534 and 544 open, the $N_2$ gas is continuously supplied into the process chamber 201. The $N_2$ gas serves as the purge gas, which improves the efficiency of removing the residual $H_2$ gas and the residual $WF_6$ which did not react or which contributed to the formation of the tungsten bulk layer from the process chamber 201.

Thereafter, for example, similarly to the first modified example, by performing a cycle wherein the pre-treatment step, the fourth residual gas removing step, the $NF_3$ gas supplying step and the third residual gas removing step are performed sequentially at least once, that is, a predetermined number of times ($n_{11}$ times, $n_{11}$ is a natural number equal to or greater than 1), the tungsten layer formed on the insulating film is etched.

By performing a cycle wherein the tungsten layer forming process of the second embodiment and the etching process are performed sequentially at least once, that is, a predetermined number of times ($n_{12}$ times, $n_{12}$ is a natural number equal to or greater than 1), the above-described tungsten film having the predetermined thickness is selectively grown on the TiN film of the wafer 200. It is preferable that the cycle is performed a plurality of times. In addition, the modified examples of the first embodiment may be appropriately combined with the second embodiment.

(8) Effects According to Second Embodiment

According to the second modified example, it is possible to provide the following effect in addition to at least one of the effects (a) through (e) of the first embodiment and the modified examples described above.

(f) By forming the tungsten nucleus layer by the tungsten nucleus layer forming process and then by forming the tungsten bulk layer using the tungsten nucleus layer as the nucleus by the tungsten bulk layer forming process, it is possible to form the tungsten film with strong adhesion to the underlying TiN film.

Other Embodiments

While the embodiments and the modified examples of the technique are described by way of an example in which the TiN film serving as a metal nitride film is formed on the substrate (wafer), the technique is not limited thereto. For example, the technique described herein may also be applied to form a film such as a tantalum nitride film (TaN film), a molybdenum nitride film (MoN film), a zinc nitride film (ZnN film) and an aluminum nitride film (AlN film).

While the embodiments and the modified examples of the technique are described by way of an example in which the $B_2H_6$ gas is used as the boron-containing gas (first reducing gas), the technique is not limited thereto. For example, instead of the $B_2H_6$ gas, a gas such as triborane ($B_3H_8$) gas may be used as the boron-containing gas. In addition, instead of the boron-containing gas, a gas such as phosphine ($PH_3$) gas serving as a phosphorus (P)-containing gas and monosilane ($SiH_4$) gas and disilane ($Si_2H_6$) gas serving as a silicon (Si)-containing gas may be used as the first reducing gas.

While the embodiments and the modified examples of the technique are described by way of an example in which the $NF_3$ gas is used as the fluorine-containing gas (etching gas), the technique is not limited thereto. For example, instead of the $NF_3$ gas, a gas such as $ClF_3$ gas, HF gas and $F_2$ gas may be used as the fluorine-containing gas. In addition, instead of the fluorine-containing gas, a gas such as a chlorine (Cl)-containing gas may also be used as the etching gas.

While the embodiments and the modified examples of the technique are described by way of an example in which the $H_2$ gas is used as the hydrogen-containing gas (second reducing gas), the technique is not limited thereto. For example, instead of the $H_2$ gas, a gas such as deuterium ($D_2$) gas serving as the hydrogen-containing gas free of other elements and ammonia ($NH_3$) gas may also be used as the second reducing gas.

The embodiments and the modified examples of the technique are described by way of an example in which the substrate processing apparatus (a batch type vertical apparatus capable of simultaneously processing the plurality of the wafers) is used to form the film. According to the above-described embodiments, the process furnace of the batch type vertical apparatus has a double-tube structure which includes the outer tube and the inner tube. According to the double-tube structure, the nozzles configured to supply the process gas are provided vertically in the inner tube of the process furnace and the exhaust port is provided at a lower portion of the inner tube. However, the technique is not limited thereto. The technique may be applied to form the film by using a process furnace having another structure. According to the embodiments and the modified examples of the technique, the process gas is supplied through the nozzles provided vertically in the inner tube. However, the process gas may be supplied through gas supply ports provided (opened) at a side wall of the inner tube. When the process gas is supplied through the gas supply ports, exhaust ports may be provided (opened) according to face the plurality of the wafers which are stacked and accommodated in the process chamber. In addition, the shape of the exhaust ports may be a hole-shape or a slit-shape.

While the embodiments and the modified examples of the technique are described by way of an example in which the tungsten layer forming process and the etching process are performed in the same process chamber, the technique is not limited thereto. For example, the tungsten layer forming process and the etching process may be performed in different process chambers.

When the various films described above are formed using these substrate processing apparatuses described above, the processing sequences and the processing conditions the same as those of the above-described embodiments and the modified examples may be used.

Preferably, the process recipe (that is, a program defining parameters such as the process sequences and the processing conditions of the substrate processing) used to form the above-described various films is prepared individually according to the contents of the substrate processing such as the type of the film to be formed, the composition ratio of the film, the quality of the film, the thickness of the film, the process sequences and the processing conditions of the substrate processing. When starting the substrate processing, the CPU 280a preferably selects an appropriate process recipe among a plurality of process recipes according to the contents of the substrate processing. Specifically, it is preferable that the plurality of the process recipes is stored (installed) in the memory device 280c of the substrate processing apparatus in advance via an electric communication line or the recording medium (the external memory device 283) storing the plurality of the process recipes. When starting the substrate processing, the CPU 280a preferably selects the appropriate process recipe among the plurality of the process recipes stored in the memory device 280c of the substrate processing apparatus according to the contents of the substrate processing. Thus, various films having different types, composition ratios, different qualities and different thicknesses may be formed at high reproducibility using a single substrate processing apparatus. In addition, since the burden on the operator such as inputting the processing sequences and the processing conditions may be reduced, various processes may be performed quickly while avoiding a malfunction of the apparatus.

The technique may be embodied by changing an existing process recipe stored in the substrate processing apparatus to a new process recipe. When changing the existing process recipe to the new process recipe, the new process recipe may be installed in the substrate processing apparatus via the electric communication line or the recording medium storing the plurality of the process recipes. The existing process recipe already stored in the substrate processing apparatus may also be directly changed to the new process recipe according to the technique by operating the input/output device of the substrate processing apparatus.

According to some embodiments in the present disclosure, it is possible to selectively grow a film with a high selectivity on a substrate with surface portions of different materials.

What is claimed is:

1. A method of manufacturing a semiconductor device comprising:
   (a) forming a second metal film on a substrate with a first metal film and an insulating film formed on a surface thereof by alternately supplying a metal-containing gas and a reactive gas onto the substrate, wherein an incubation time on the insulating film is longer than that on the first metal film;
   (b-1) supplying a first modifying gas comprising an oxidizing gas or a nitriding gas onto the substrate to modify the second metal film;
   (b-2) supplying an etching gas comprising a halide onto the second metal film modified in (b-1);
   (c) alternatively repeating (b-1) and (b-2) to remove the second metal film formed on the insulating film while allowing the second metal film to remain on the first metal film,
   wherein the second metal film is selectively grown on the first metal film by alternately repeating (a) and (c).

2. The method of claim 1, further comprising:
   (d) supplying a second modifying gas onto the substrate to modify the substrate after performing (b-2),
   wherein the second metal film formed on the insulating film is removed by alternately repeating (b-2) and (d).

3. The method of claim 2, wherein the second modifying gas comprises a hydrogen-containing gas.

4. The method of claim 1, wherein the second metal film comprises a tungsten film or a tungsten nitride film.

5. The method of claim 1, wherein the reactive gas comprises a first reducing gas and a second reducing gas, and
   wherein (a) comprises:
   (a-1) alternately supplying the metal-containing gas and the first reducing gas onto the substrate to form a first metal layer on the substrate; and
   (a-2) supplying the metal-containing gas and the second reducing gas onto the first metal layer formed on the substrate to form the second metal film on the substrate.

6. The method of claim 5, wherein the metal-containing gas comprises a tungsten fluoride, the first reducing gas comprises one selected from a group consisting of diborane, monosilane and disilane, the second reducing gas comprises a hydrogen gas, and the second metal film comprises a tungsten film.

7. The method of claim 1, further comprising:
   (d) supplying a second modifying gas onto the substrate to modify the substrate after performing (b-2).

* * * * *